(12) United States Patent
Cheng et al.

(10) Patent No.: US 6,861,870 B1
(45) Date of Patent: Mar. 1, 2005

(54) DYNAMIC CROSS POINT SWITCH WITH SHADOW MEMORY ARCHITECTURE

(75) Inventors: Jason Cheng, Fremont, CA (US); Satwant Singh, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/370,232

(22) Filed: Feb. 19, 2003

Related U.S. Application Data

(63) Continuation-in-part of application No. 10/133,016, filed on Apr. 26, 2002.
(60) Provisional application No. 60/356,507, filed on Feb. 11, 2002.

(51) Int. Cl.[7] .................................................. G06F 7/38
(52) U.S. Cl. ........................... 326/41; 326/39; 326/40; 326/38; 365/49; 365/230.03; 365/189.12
(58) Field of Search ............................. 326/41, 39, 40, 326/38; 365/49, 230.09

(56) References Cited

U.S. PATENT DOCUMENTS

| | | | | |
|---|---|---|---|---|
| 5,404,055 A | * | 4/1995 | Shankar et al. | 326/41 |
| 5,811,987 A | * | 9/1998 | Ashmore et al. | 326/39 |
| 5,818,254 A | * | 10/1998 | Agrawal et al. | 326/41 |
| 5,945,841 A | * | 8/1999 | Mason et al. | 326/38 |
| 6,028,446 A | * | 2/2000 | Agrawal et al. | 326/40 |
| 6,329,839 B1 | * | 12/2001 | Pani et al. | 326/41 |
| 6,456,542 B1 | * | 9/2002 | Roohparvar | 365/189.12 |
| 6,724,220 B1 | * | 4/2004 | Snyder et al. | 326/41 |

* cited by examiner

Primary Examiner—Michael Tokar
Assistant Examiner—Lam T. Mai
(74) Attorney, Agent, or Firm—MacPherson Kwok Chen & Heid LLP

(57) ABSTRACT

The fuse points within a programmable AND array may be programmed with configuration signals to select for logical signals to form product term outputs in a logic mode. In a switch mode, a subset of these fuse points may be programmed with dynamically-created operating signals to form a cross point switch matrix.

20 Claims, 19 Drawing Sheets

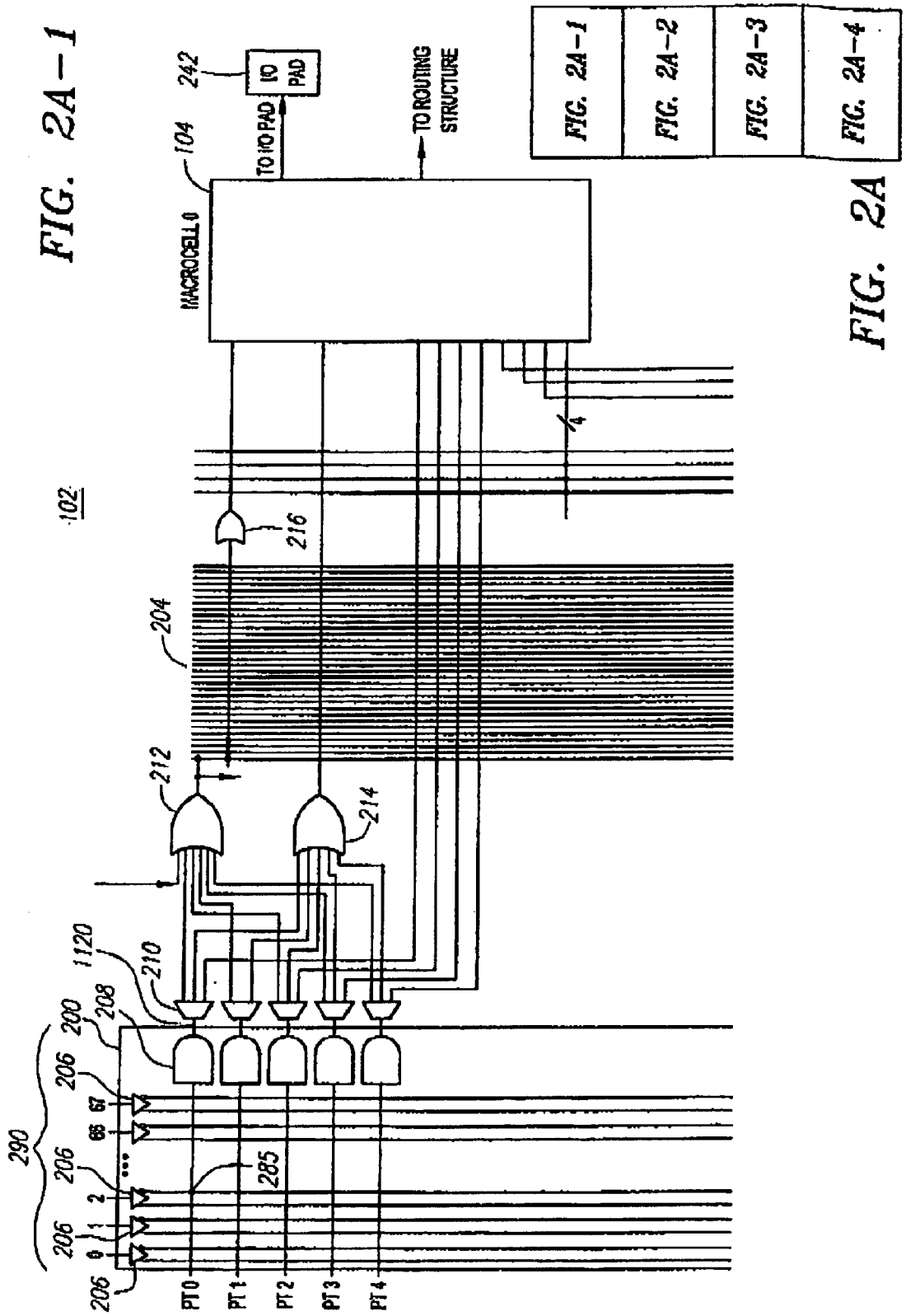

*FIG. 6A-1* *FIG. 6A*
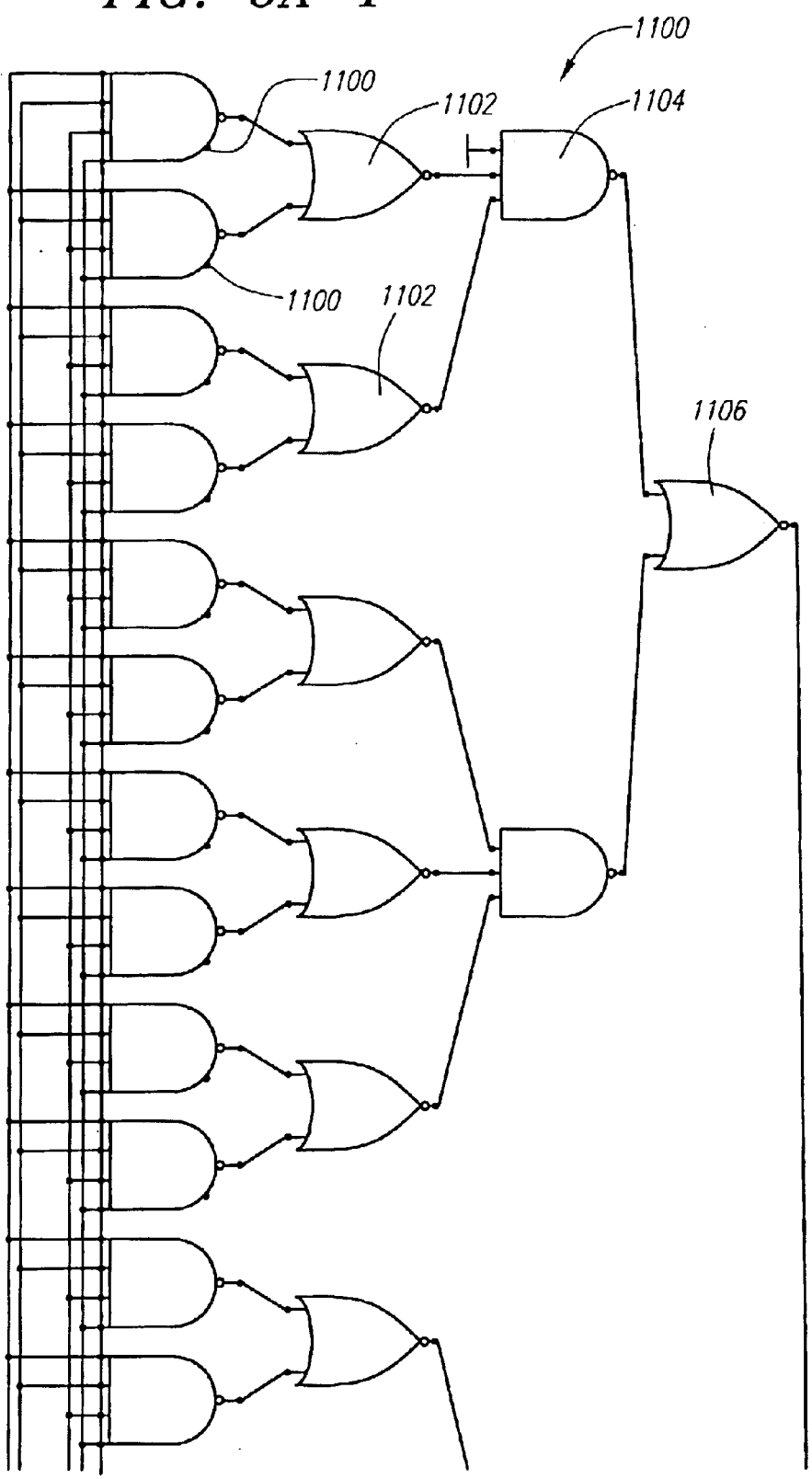
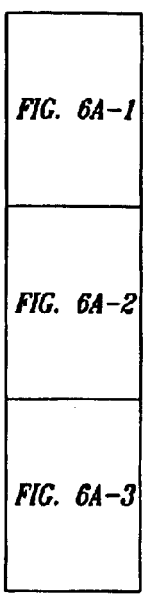

| | Switch timing parameters |
|---|---|
| Symbol | Parameter |
| twsa | Switch Address Clock (ACLK) frequency, twsa = 1/fswa |
| tsu1 | Address / Data / Control set up time before ACLK / DCLK |
| th1 | Address / Data / Control hold time after ACLK / DCLK |
| tco | Data Clock (DCLK) to valid Data out (DOUT) |
| tnewconf | Address Clock (ACLK) to valid DOUT |
| tswch | Switch delay expressed as an adder for tpd |

DYNAMIC CROSS POINT SWITCH WITH SHADOW MEMORY ARCHITECTURE

CLAIM OF PRIORITY

This patent application is a continuation-in-part of co-owned U.S. Ser. No. 10/133,016, filed Apr. 26, 2002, which is hereby incorporated by reference in its entirety, that in turn claims the benefit of co-owned U.S. Provisional Patent Application No. 60/356,507, entitled "DEVICE AND METHOD WITH GENERIC LOGIC BLOCKS," filed on Feb. 11, 2002, which is hereby incorporated by reference in its entirety.

Incorporation by Reference

The following co-assigned U.S. Patent Applications and Patents are hereby incorporated by reference in their entireties: (1) U.S. patent application Ser. No. 09/704487, entitled "Wide Input Programmable Logic System And Method" filed on Nov. 2, 2000; and (2) U.S. Pat. No. 6,067,252, entitled "Electrically Erasable Non-Volatile Memory Cell With Virtually No Power Dissipation", filed on May 26, 1999.

TECHNICAL FIELD

The present invention relates generally to programmable devices. Specifically, the present invention relates to a programmable semiconductor device configurable for logic and cross point switch purposes.

BACKGROUND

In a conventional programmable logic device (PLD) such as a complex programmable logic device (CPLD), a user implements a desired logical function by configuring logic blocks to perform the desired logical function. If a user desires other features such as memory, additional components besides logic blocks are integrated into the PLD to perform the desired feature. For example, a CPLD may have a number of logic blocks and one or more memory blocks. The ratio of the memory blocks to logic blocks is thus fixed by a given CPLD design. However, it is difficult to predict the desired ratio for any given user. One user may wish to have more memory whereas another user may wish for more logic.

In the digital communication applications, a user often has the need for fully-populated cross point switches in addition to configurable logic capability. To configure a programmable AND array to function as a cross point switch requires the use of many product terms. For example, a 32×32 bit cross point switch is equivalent to thirty-two 32:1 multiplexers. Implementing one of these multiplexers with product terms requires a total of 32 product terms (and thus 32 product term circuits). Thus, implementing a 32×32 bit cross point switch using a programmable AND array requires 1024 product term circuits, which is a substantial demand on logic resources. These 1024 product term circuits would be unavailable to perform a desired logic function when implementing the cross point switch. Just as with memory, it is difficult to predict the ratio of logic/switch capability desired by any given user.

Accordingly, there is a need in the art for a PLD having logic blocks that are configurable to function as logic or as a cross point switch without requiring an excessive amount of product terms.

SUMMARY

One aspect of the invention relates to a programmable logic device. The device comprises a plurality of programmable blocks configured to receive signals from a routing structure. Each programmable block supports a logic mode and a switch mode and comprises an array of product term circuits. Each product term circuit is programmable in response to configuration signals so as to select logic signals received from the routing structure and provide a product term output based on the selected logic signals in the logic mode. A switch subset of the product term circuits in each plurality are programmable in response to a set of control signals coupled from the routing structure in the switch mode such that each product term circuit in the switch subset may select a signal from a set of data signals coupled from the routing structure and provide a data output based on the selected signal, whereby in the switch mode each product term circuit in the switch subset acts as a switch with respect to its selected signal.

Another aspect of the invention relates to a method of operating a programmable logic device having a programmable logic block including a plurality of product term circuits coupled to receive signals from a routing structure. In one act of the method, each product term circuit is programmed with configuration signals. Based upon the configuration signal programming, the method continues by selecting at each product term circuit a set of logic signals coupled from the routing structure and processing the set of logic signals in each product term circuit to produce a product term output. In another act of the method, a switch subset of the product term circuits are programmed with control signals coupled from the routing structure such that each product term circuit in the switch subset may select a signal from a set of data signals coupled from the routing structure and provide a data output based on the selected signal. Based upon the control signal programming, the method continues by routing the set of data signals through the switch subset of product term circuits to provide a set of the data outputs.

BRIEF DESCRIPTION OF THE DRAWINGS

FIG. 6b illustrates a complex NAND gate in the tiered logic structure of FIG. 6a.

FIGS. 7I–7L illustrate exemplifying timing diagrams for the programmable logic block of FIG. 7A.

Use of the same reference symbols in different figures indicates similar or identical items.

DETAILED DESCRIPTION

The present invention provides a programmable logic device comprising programmable logic blocks. Each programmable logic block includes a plurality of product term circuits that form a programmable AND array. The product term output from each product term circuit is the product (the logical AND function) of one or more logical inputs selected from a set of possible logical inputs. The selection of the logical inputs used to form a product term output depends upon the desired logical function a user wants to implement. Based upon the desired logical function, fuse points within each product term circuit are activated to "fuse in" the required logical inputs. Each fuse point comprises a memory cell such as an SRAM memory cell or an EEPROM memory cell. Configuration signals control the activation of the fuse points as is known in the art.

In the present invention, the memory cells controlling the fuse points within each product term circuit may be used for other purposes. For example, if just one input is fused in for a given product term circuit, the logical AND of the corresponding product term output has no effect— the logical AND of a single variable does not change its value. In this fashion, a product term circuit may be used as part of a memory or as part of switch matrix as will be explained in further detail herein.

Figure 1:
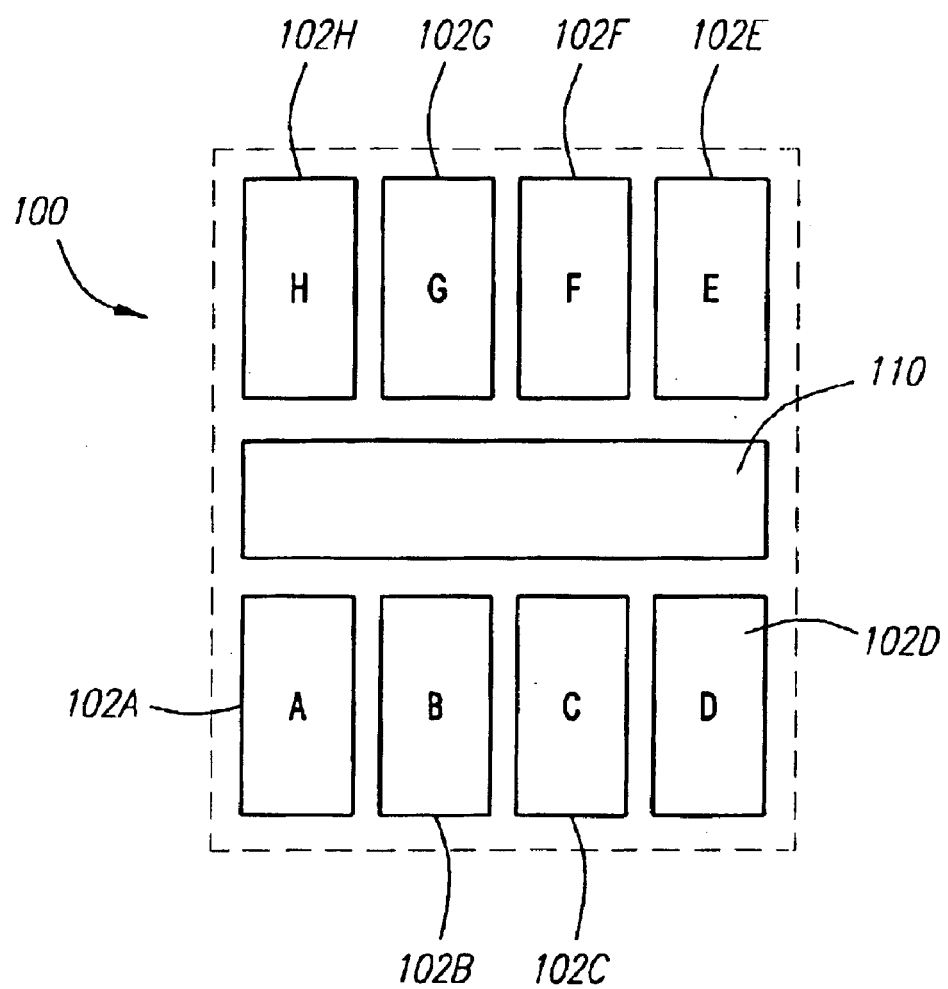
FIG. 1 illustrates one embodiment of a programmable device with a plurality of programmable logic blocks.

FIG. 1 illustrates one embodiment of a programmable device 100 with a plurality of programmable logic blocks 102A–102H. Each programmable logic block 102A–102H comprises a plurality of product term circuits as will be described further herein. The programmable device 100 may be implemented on a single microchip. There are eight programmable logic blocks 102A–102H in FIG. 1, but other embodiments of the programmable device 100 may have any suitable number of programmable logic blocks, such as 16, 32, 64, 1000 or 10,000 programmable logic blocks. Also, the programmable logic blocks 102A–102H may be arranged in a number of different configurations.

The programmable logic blocks 102A–102H receive and transmit signals, such as data and control signals, via a routing structure 110. The device 100 may also have an isolated, non-volatile memory block (not illustrated), such as EEPROM, that transfers configuration signals and instructions to the programmable logic blocks 102A–102H upon power-up if the fuse points comprise volatile memory such as SRAM cells. Each programmable logic block 102 may be configured to operate in either a logic mode or switch mode as desired by a user. The logic mode operation will be described first.

Logic Mode

Figures 2, 2A:
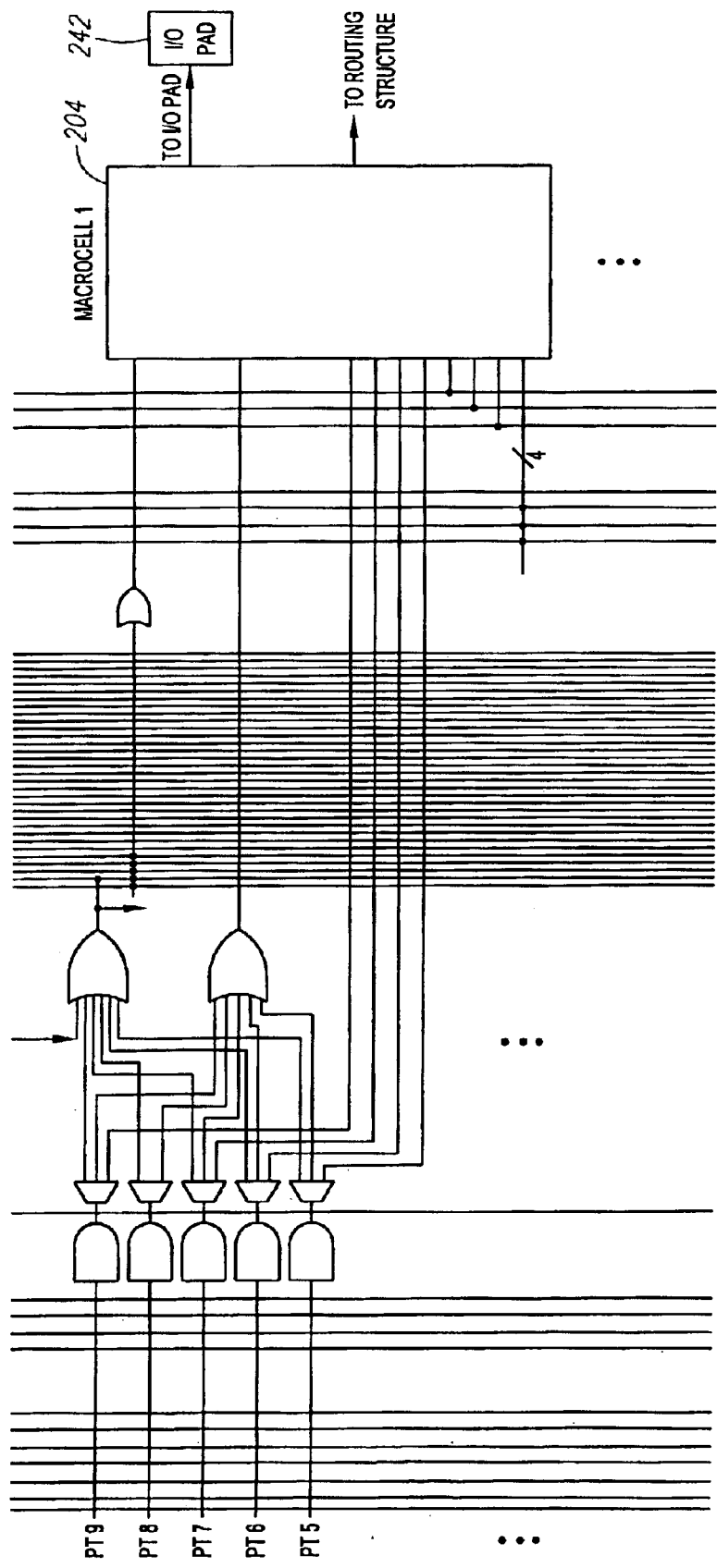
FIG. 2 is a block diagram for a programmable logic block of FIG. 1.

FIG. 2 illustrates one embodiment of a programmable logic block 102 of FIG. 1. The programmable logic block 102 includes a programmable AND array 200 comprising a plurality of product term circuits such as illustrated circuits 208. Although each programmable logic block 102 may include any desired number of product term circuits 208, FIG. 2 illustrates an embodiment having 164 product term circuits 208. Each product term circuit may receive 68 logical inputs 290 coupled from routing structure 110 (FIG. 1). However, the actual number of logical inputs 290 coupled into each programmable logic block 102 is not important and may be changed in alternative embodiments. Input ports 206 form the true and complement of each logical input 290. Thus, each product term circuit 208 may form the logical AND of up to 136 input variables. From these logical inputs, 164 product term outputs 1120 are provided by product term circuits 208, such that each product term output corresponds uniquely to its product term circuit 208. Each product term circuit 208 has fuse points 285 (discussed further below) corresponding to each of the available 136 inputs such that if a fuse point 285 is activated, the corresponding input is selected. Accordingly, each product term circuit 208 includes 136 fuse points for each of its 136 input variables.

Figures 2, 2A, 3:
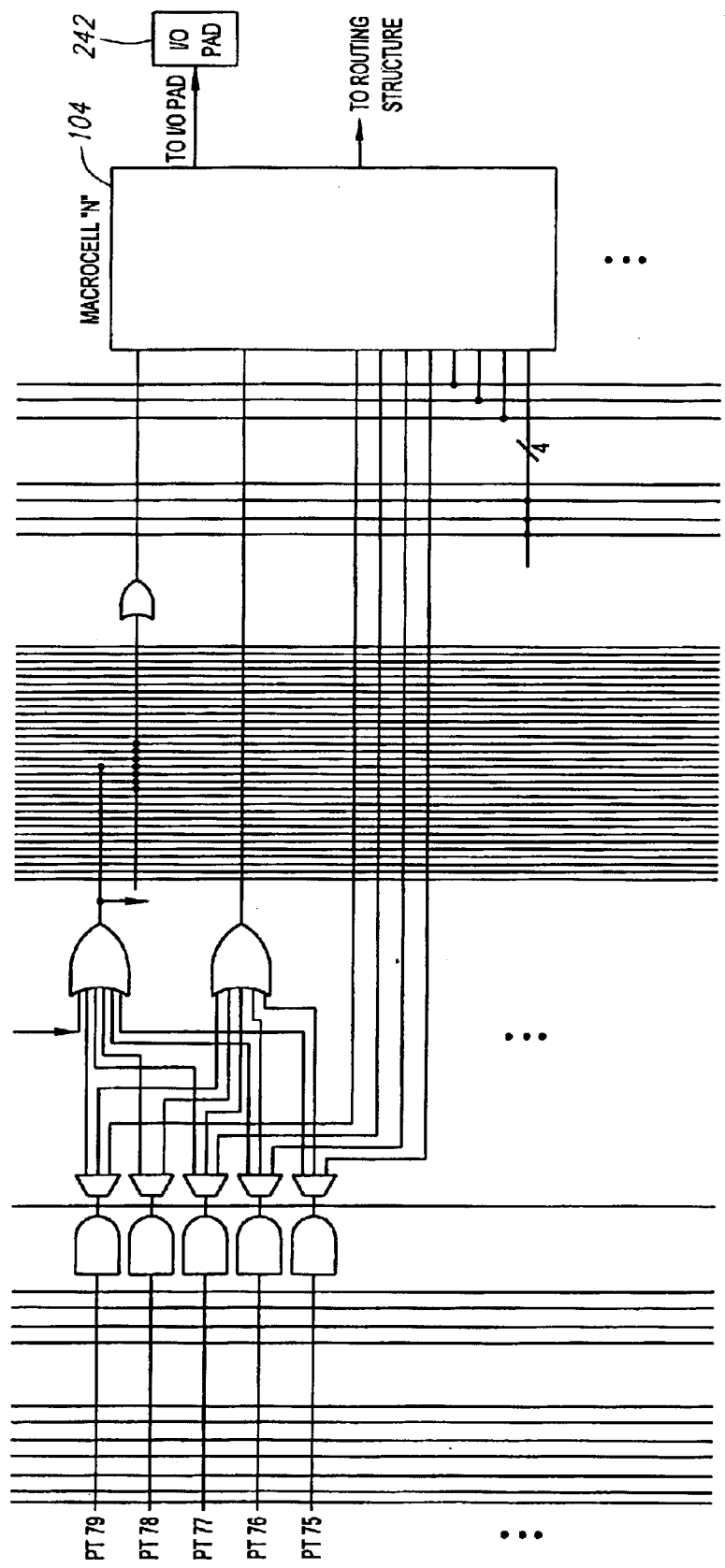
FIG. 3 illustrates one embodiment of an SRAM memory cell that may be used in a product term circuit in the programmable logic block of FIG. 2.
Figures 2, 2A, 3, 4:
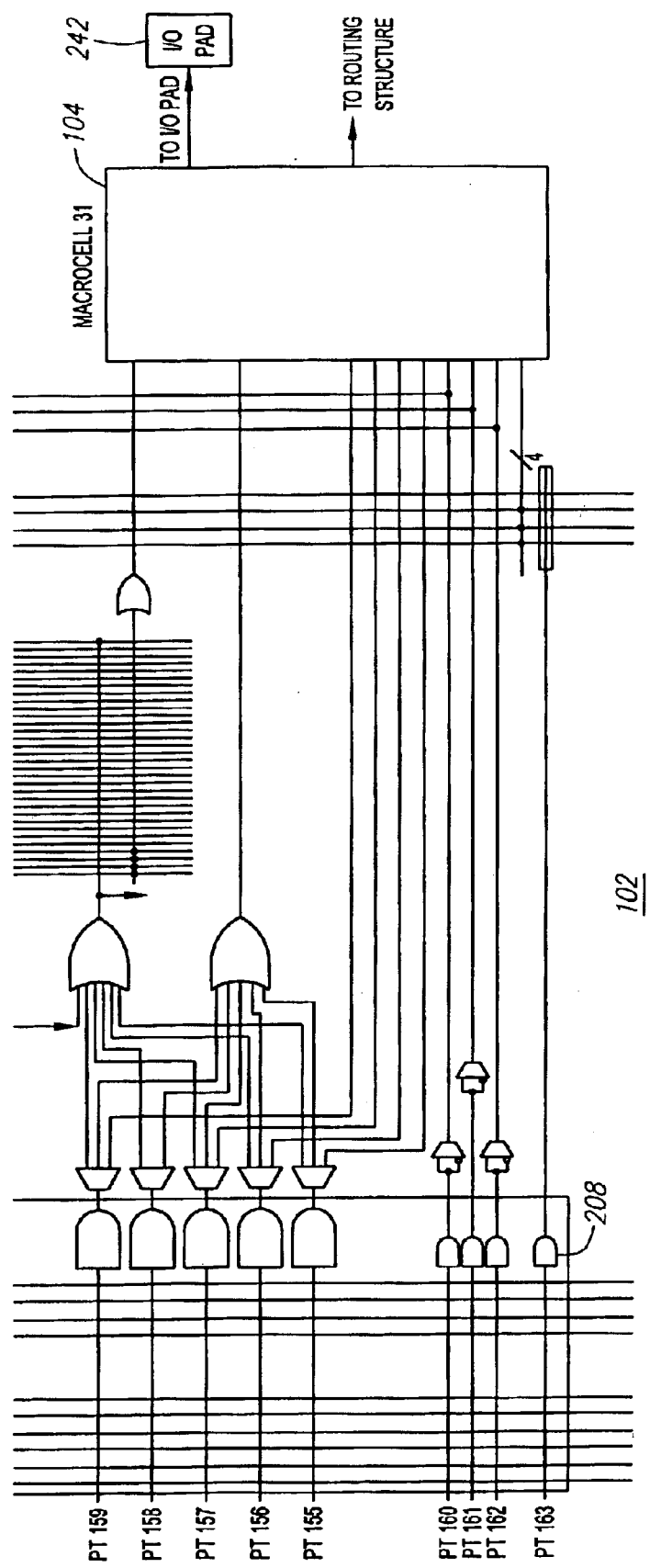
FIG. 4 illustrates one embodiment of a SRAM cell, which is an enhanced version of the SRAM cell in FIG. 3.
Figure 3:
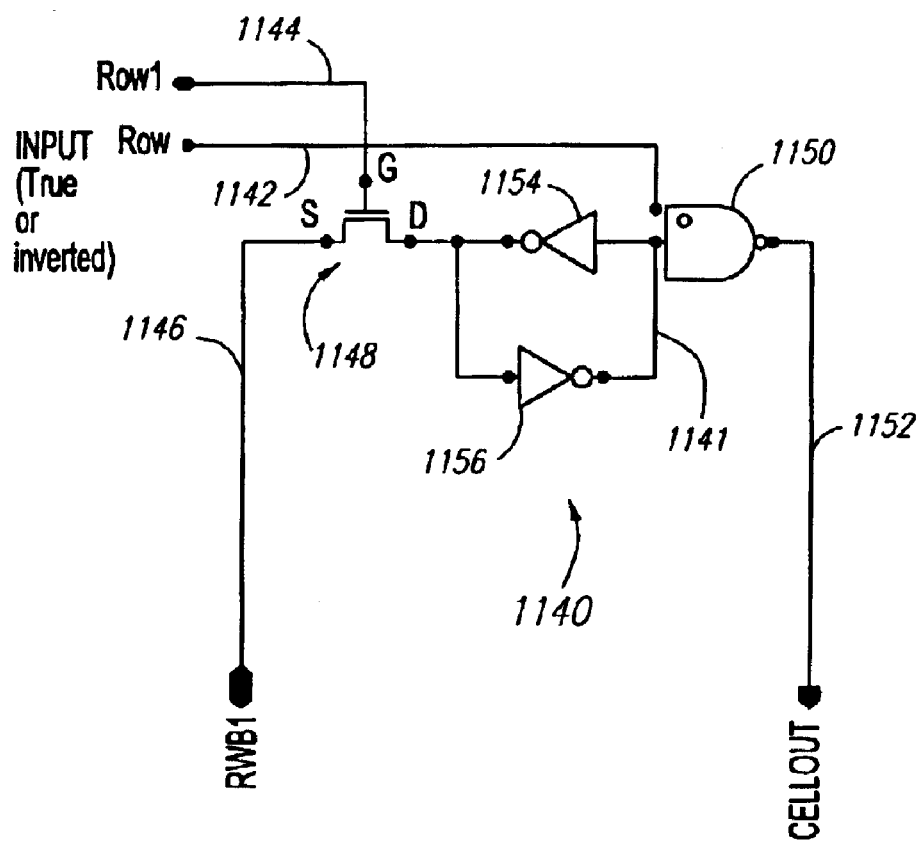
Figure 4:
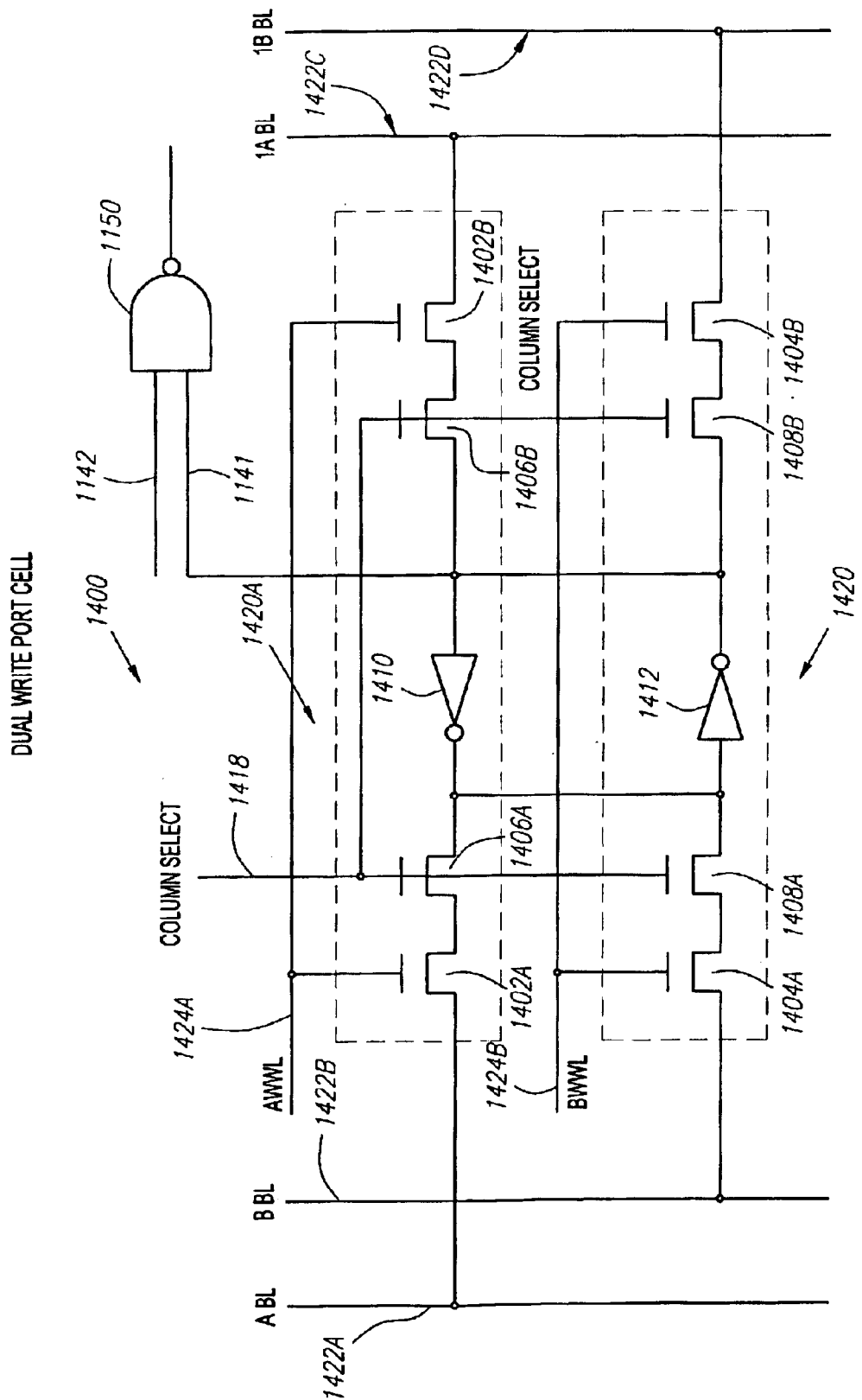
Figure 5:
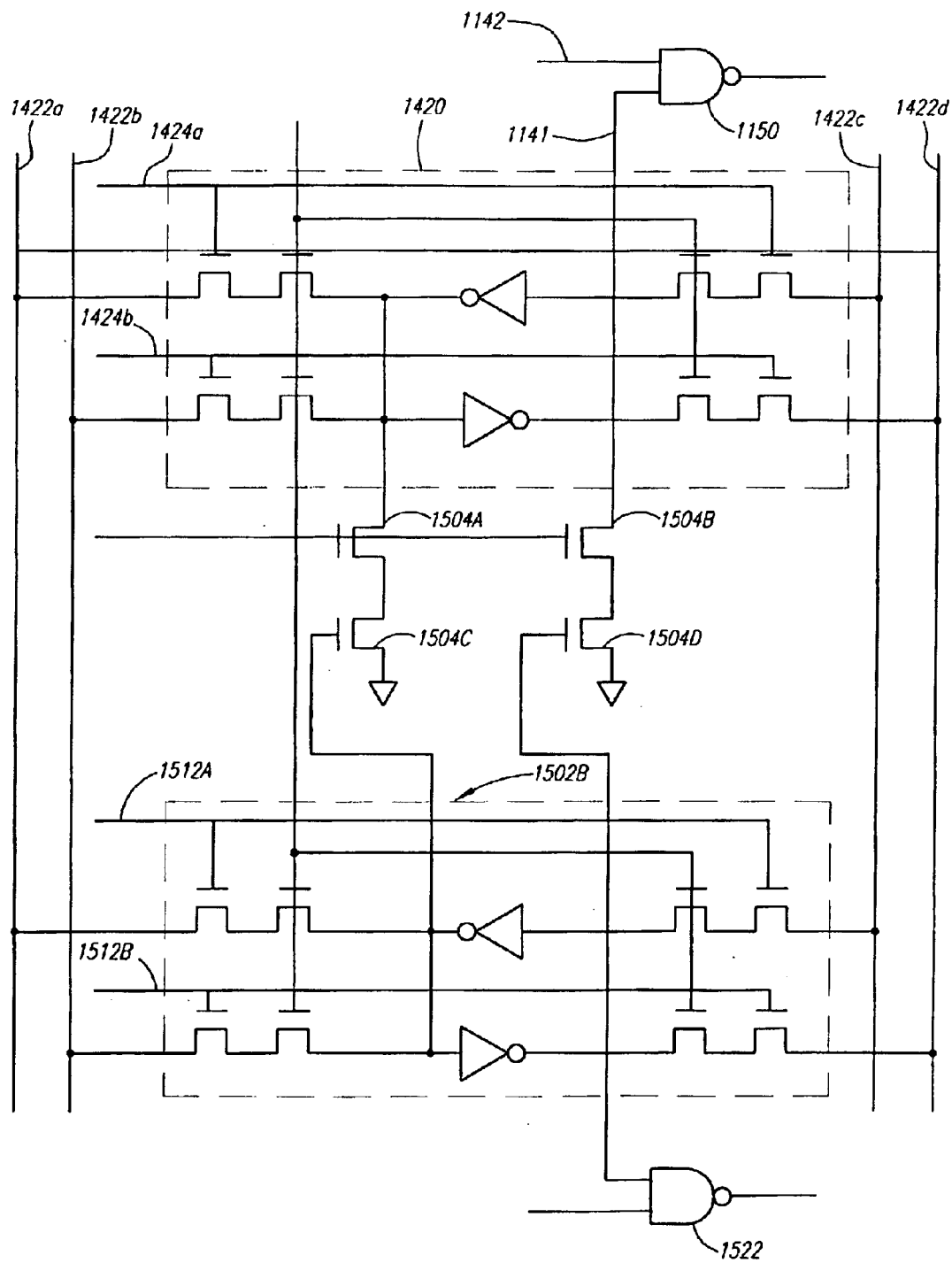
FIG. 5 illustrates one embodiment of a dual write port SRAM cell with shadow memory, which can be used in the programmable logic block of FIG. 1 to implement a switch.

Referring to FIGS. 3, 4, and 5, a variety of SRAM or other type of volatile or non-volatile memory cells may be used to implement the fuse points 285. For example, SRAM cell 1140 in FIG. 3 may store a configuration bit using cross-coupled inverters 1156 and 1154. The "Q" output 1141 (which may also be denoted the fuse value 1141) of SRAM cell 1140 is received at NAND gate 1150, which also receives a logical input carried on line 1142. This logical input corresponds to one of the 136 variables coming from input ports 206. If fuse value 1141 is a logical one, NAND gate 1152 passes an inverted version of logical input on output line 1152. In this fashion, the logical input is "fused" onto output line 1152 such that SRAM cell 1140 forms a fuse point that controls whether its corresponding logical input can affect the product term output. Because each product term output is the logical AND of whatever number of logical inputs are fused in (from the possible set of 136 inputs), each product term circuit 208 processes up to 136 logical input variables carried on 136 input lines 1142.

Referring again to FIG. 2 and 3, the SRAM cells 1140 for all of the product term circuits 208 may be arranged in rows and columns such that if a given SRAM cell's word line 1144 is held high, SRAM cell 1140 will store the inverse of whatever logical state its bit line 1146 is in. In turn, the activation of the word lines 1144 and bit lines 1146 may be controlled by configuration signals coupled from a non-volatile configuration memory (not illustrated) such as an EEPROM. Should the fuse points be controlled by a dual-write port SRAM cell such as SRAM cell 1420 shown in FIGS. 4 and 5, column select 1418, dual word lines 1424A and 1424B, dual bit lines 1422A and 1422B, and complement bit lines 1422C and 1422D control the programming of SRAM cells 1420 in a similar fashion as may also be determined by configuration signals. The EEPROM cells storing the configuration signals may be "zero power" memory cells that consume substantially zero DC current during configuration and erasure as described in (1) U.S. patent application Ser. No. 09/704487, entitled 'Wide Input Programmable Logic System And Method,' which was filed on Nov. 2, 2000 by the Assignee of the present Application, and (2) U.S. Pat. No. 6,067,252, entitled 'Electrically Erasable Non-Volatile Memory Cell With Virtually No Power Dissipation,' which was filed on May 26, 1999 by the Assignee of the present Application. It will be appreciated, however, that other types of non-volatile memory cells such as conventional EEPROM cells may also be used with the present invention. Moreover, the use of volatile memory cells to store the configuration signals may also be used with the present invention.

Figures 2, 6A:
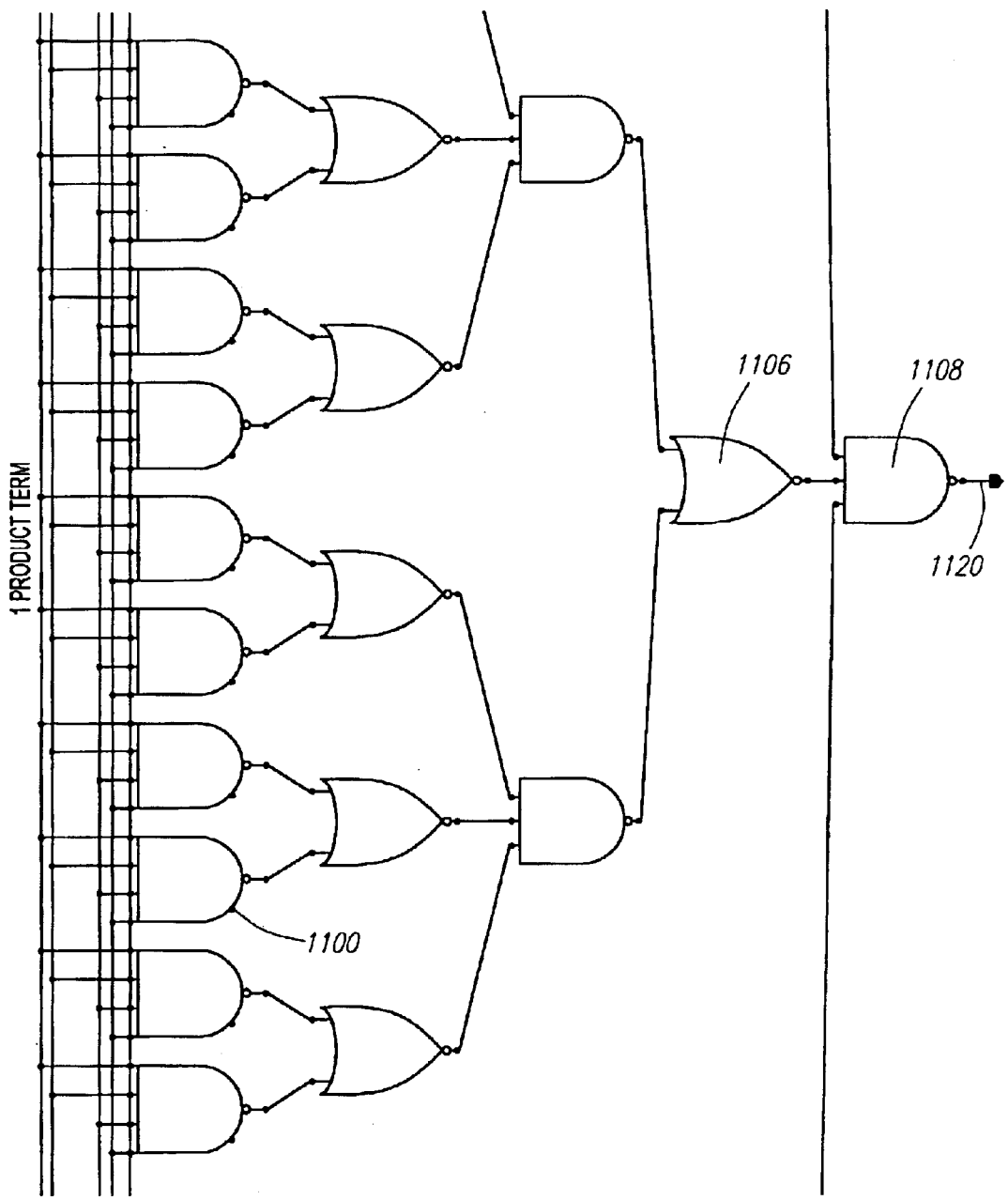
FIG. 6a illustrates one embodiment of tiered logic structure for use in a product term circuit in the programmable logic block of FIG. 2.
Figures 3, 6A, 6B:
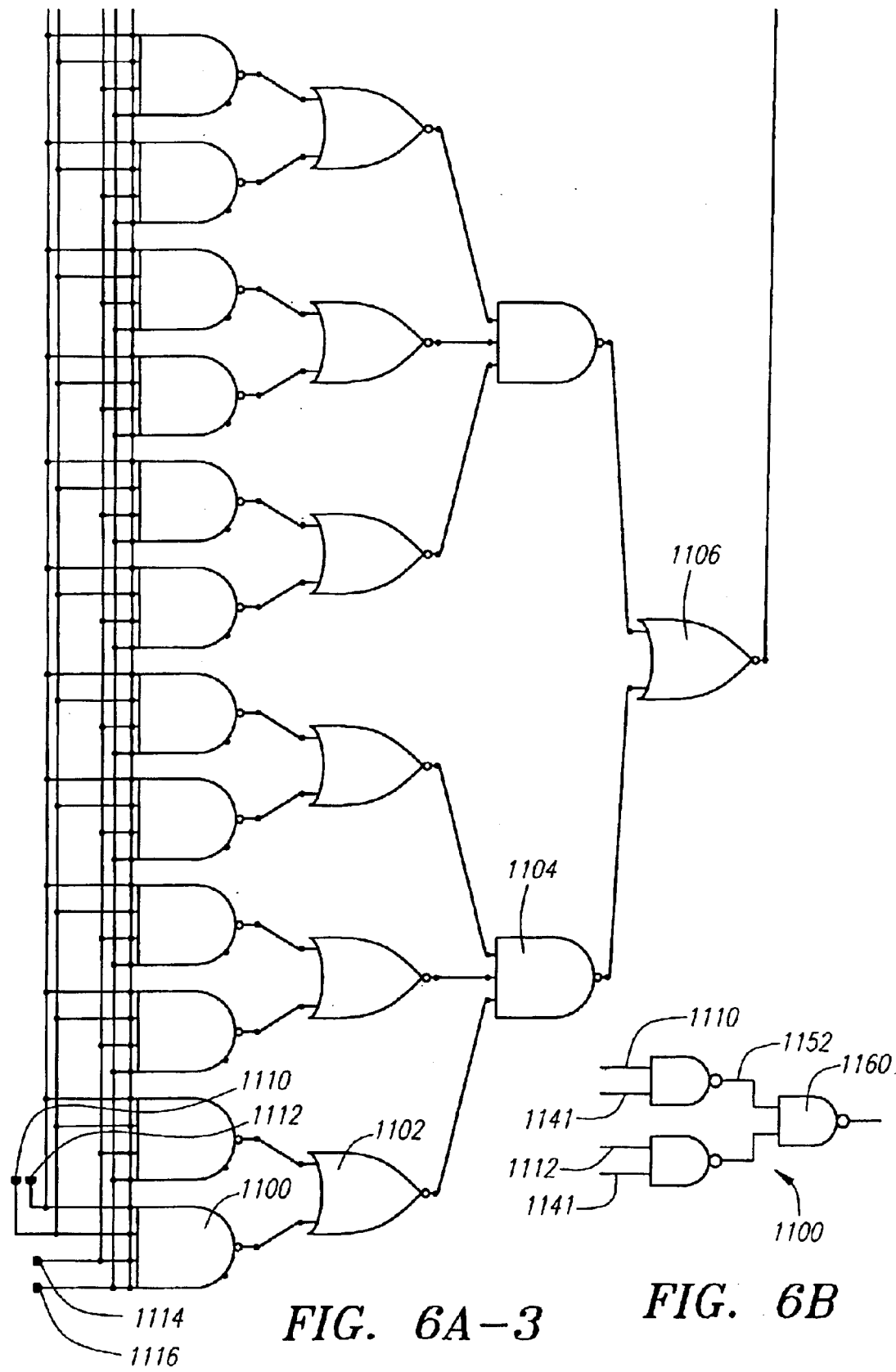

Once all the applicable logical variables have been fused in for a given product term circuit 208, the corresponding product term output 1120 may be formed using a sense amplifier as is known in the art. Alternatively, a tiered logic structure such as described in U.S. patent application Ser. No. 09/704487 may be used to form the product term output. FIG. 6a illustrates one embodiment of a tiered logic structure 1100 for forming a product term output 1120. Each first level "complex" NAND gate 1100 receives the true 1110 and complement values 1112 of a logical input 290 as produced by an input port 206 of FIG. 2. Similarly, each complex NAND gate 1100 receives the SRAM fuse values (the Q output 1141) corresponding to inputs 1110 and 1112. It will thus be appreciated that complex NAND gate 1100 is illustrated for functional purposes only. To permit the individual fusing of each input 1110 and 1112, complex NAND gate 1100 could be implemented by, for example, two NAND gates 1150 (discussed with respect to FIG. 3) as seen in FIG. 6b, where one NAND gate 1150 corresponds to the true input 1110 and the other corresponds to the complement input 1112. Each NAND gate 1150 also receives the fuse signal 1141 (discussed with respect to FIG. 3) corresponding to the relevant input (either 1110 or 1112). The outputs 1152 from each NAND gate 1150 could then be processed by an NAND gate 1160 to form the output of complex NAND gate 1100. Note that if an actual (rather than "complex") NAND gate was used in place of complex NAND gate 1100, individual fusing could not be accomplished because the fuse signal 1141 for the true input 1110 would control whether the complement input 1112 could be fused in and vice versa.

Additional tiers of logic formed by NOR gates 1102, NAND gates 1104, NOR gates 1106, and NAND gate 1108 complete the tiered logic structure 1100. It will be appreciated that these logic gates (as opposed to complex NAND gates 1100) are conventional logic gates because the fusing has already been accommodated by complex NAND gates 1100.

Each product term circuit 208 thus includes the fuse points 285 and the structure necessary to form the AND of whatever inputs are fused in. For example, a product term circuit 208 may include 136 SRAM cells 1140 (the fuse points) to provide 136 inputs on lines 1110 and 1112, whose logical AND product 1120 is produced by the tiered logic structure 1100 discussed with respect to FIG. 6a. It will also be appreciated that other types of structures may be used to form the AND of the fused-in logical inputs such as a sense amplifier.

Referring back to FIG. 2, a plurality of macrocells 104 may register various sums of product term outputs 1120 from the product term circuits 208. For example, each macrocell 104 may receive the output of an OR gate 214. In turn, each OR gate 214 may form the sum of up to 5 product term outputs 1120 depending upon its configuration. Accordingly, each macrocell 104 corresponds to 5 product term circuits 208. In an embodiment having 32 macrocells 104, there would thus be 160 corresponding product term circuits 208. An additional plurality such as 4 product term circuits 208 may be used to form control signals for the macrocells 104. To permit the option of processing wider input logic functions, each macrocell 104 may also receive a product term sharing output from a corresponding OR gate 212. In turn, the output from OR gate 212 may be fused into an output from a product term sharing array 202 that is also driven by the outputs of 6 other input OR gates 212. Each OR gate 212 may receive the 5 product term outputs discussed with respect to OR gate 214. In addition, OR gates 212 may receive an output from other macrocells 104. In this fashion, each macrocell 104 may register various sum of product term outputs depending upon the logical functions a user wishes to implement. It will be appreciated, however, that the manner each macrocell 104 may register various sum of product outputs is unimportant to the present invention. What is relevant to the present invention is that a programmable logic block 102 include product term circuits having fuse points as will be further explained with respect to the switch mode.

Switch Mode

Referring again to FIG. 2, each programmable AND array 200 includes a plurality of product term circuits 208. Each product term circuit 208 provides an AND of the selected inputs as its product term output. As discussed earlier, should only one logical input be fused in to a given product term circuit 208, the AND function has no effect— i.e., the logical AND of a single variable does not change its value. As such, if just one fuse point 285 is activated and the logical input is treated as a data signal, each product term circuit acts as a single switch point, fusing an input line onto an output line. By then combining multiple numbers of similarly-configured product term circuits 208, a cross point switch matrix 1006 may be functionally created as shown in FIG. 7a.

Figure 7A:
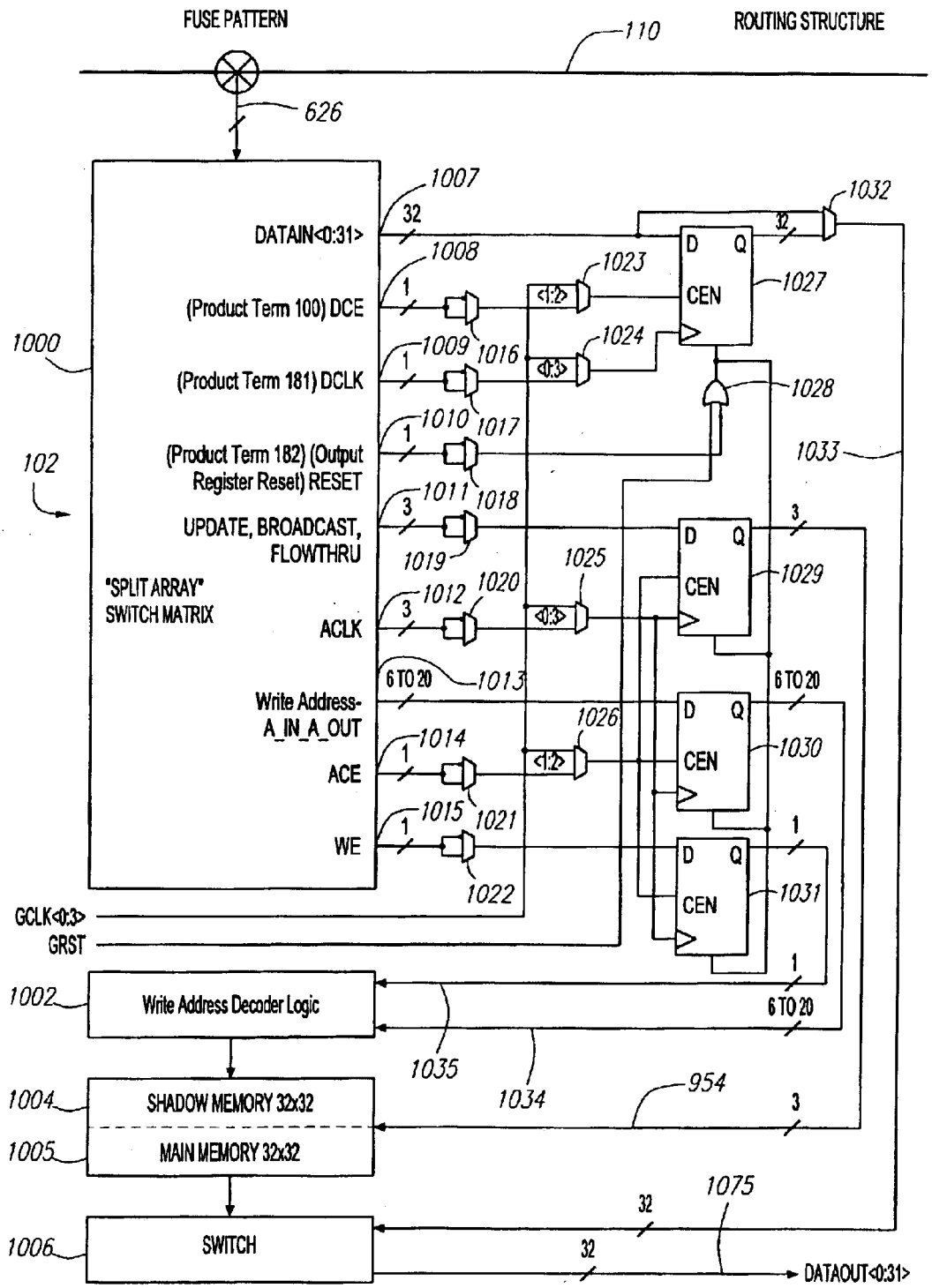
FIG. 7A illustrates one embodiment of a programmable logic block of FIG. 1 in a switch mode with a main memory and a shadow memory.

As seen in FIG. 7a, the product term circuits 208 may be split into an input routing pool (IRP) portion 1000 and a main memory portion 1005. The splitting is for functional purposes only in that the product term circuit 208 structure discussed with respect to FIG. 2 remains unchanged. For example, IRP portion 1000 may use 32 product term circuits 208 and main memory portion 1005 may also use 32 product term circuits 208 (out of the total product term circuits 208 contained with programmable AND array 200). As will be explained further herein, each product term circuit 208 in main memory portion 1005 may act as a switch with respect to a data input coupled on bus 626 that serves to couple logic inputs 290 from routing structure 110. In other words, each product term circuit 208 in main memory portion 1005 may have just one fuse point activated. Referring back to FIG. 3, recall that each product term circuit 208 may include a plurality (such as 136) of input lines 1142. During the logic mode, input lines 1142 carry logical variables. However, during the switch mode, input lines 1142 are configured to carry data inputs coupled from IRP 1000 as will be explained further herein. Because each product term circuit 208 is configured to switch a single data variable during the switch mode (to prevent the logical AND from affecting the switched variable), only a single input line 1142 will carry the relevant data input to be switched during the switch mode. The fuse point (such as SRAM cell 1140) corresponding to this data input/input line 1142 combination must then be activated to effect the switch operation. Unlike the configuration-signal-driven programming of the fuse points during the logic mode, the fuse points within main memory portion 1005 may be programmed dynamically with control signals coupled over the bus 626 during the switch mode as processed by IRP 1000. Accordingly, these control signals must be processed quite differently from the data signals. As such, the order in which these signals are presented is has a functional result. This ordering relationship is absent in the logic mode— e.g., the AND of variables A and B is the same as the AND of variables B and A. In the switch mode of operation, input routing pool provides the proper re-ordering of data signals and control signals coupled from routing structure 110. It will be appreciated that this re-ordering of variables may be performed by the routing structure 110 itself. However, the present invention relieves this added burden on the routing structure by re-use of the product term circuits 208 within IRP portion 1000 as follows.

Figure 8:
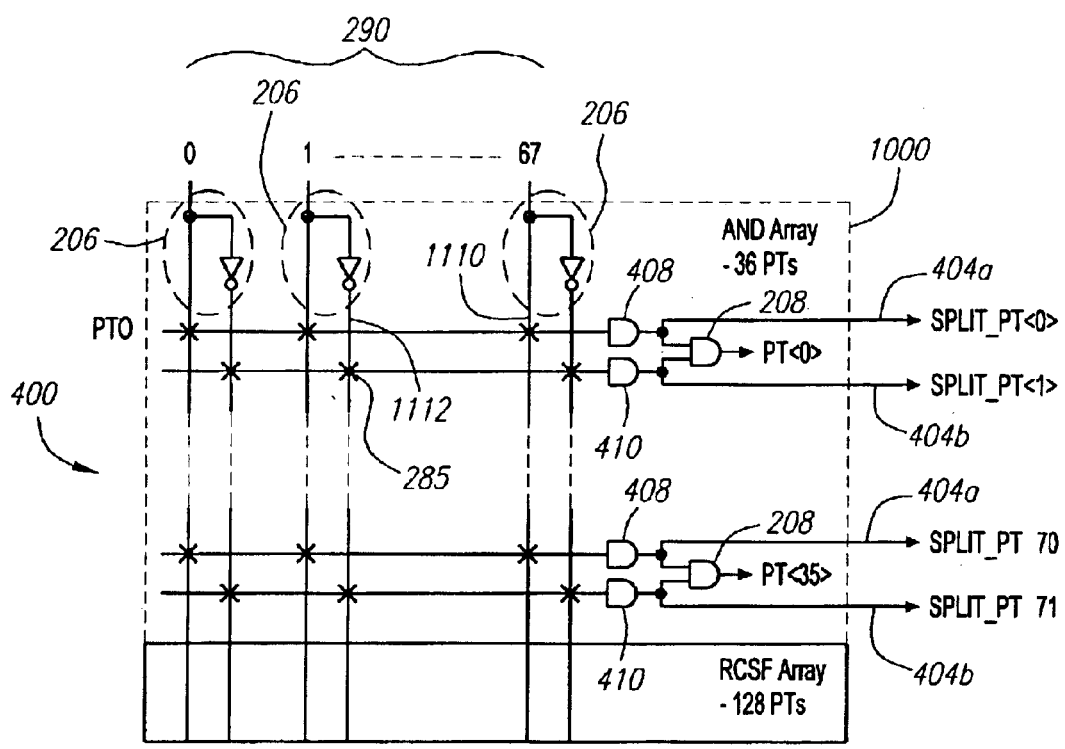
FIG. 8 illustrates one embodiment of a split-AND array used to form the input routing pool in FIG. 7A.

Each product term circuit 208 within IRP portion 1000 may be "split" to provide split product term outputs 404a and 404b as illustrated in FIG. 8. Whereas both the true and complement of a logical input 290 may be fused in to affect a product term output as discussed above with respect to FIG. 2, split product term 404A is the logical AND of only the true inputs 1110 (discussed with respect to FIG. 6a) and split product term 404b is the logical AND of the complement logical inputs 1112 (also discussed with respect to FIG. 6a). Just as with the main memory portion 1005, each split product term 404 from IRP portion 1000 results from the activation of just one fuse point 285 during switch mode operation. Thus, each split product term 404a and 404b is the AND of only a single input variable. In this fashion, IRP 1000 may reorder inputs without changing their values. By splitting the product term outputs, the number of product term circuits 208 used to form IRP 1000 is reduced because each product term circuit 208 provides two outputs in a split product term mode. It will be appreciated, however, that the switch mode of the present invention may be practiced without the use of split product terms at the cost of using more product term circuits to perform the input re-ordering function of IRP 1000. Should IRP 1000 contain 36 product term circuits 208, a total of 72 split product terms 404 are available for re-ordering of data and control inputs.

Recall that each programmable AND array 200 (FIG. 2) associates with a plurality of macrocells 104 for registering sum of product term outputs or other logical outputs from programmable AND array 200. For example, each programmable AND array 200 may associate with 32 macrocells 104 such that each macrocell 104 may register the sum of five product term outputs. Should these macrocells 104 be used to also register the switch output carried on bus 1075 shown in FIG. 7a, a limit is placed on the maximum number of switch outputs during switch mode that corresponds to the number of macrocells 104. Thus, if there are 32 macrocells 104, the maximum number of bits in the switch output bus 1075 would be 32.

Accordingly, (assuming that the number of logical inputs 290 in FIG. 2 capable of being processed in the logic mode exceeds 16) only a subset of the fuse points within each product term circuit 208 in main memory portion 1005 need be programmed during switch mode. It will be appreciated that as used herein, "subset" may refer to some or all of a set. For example, to form a 32×32 cross point switch 1006, only 32 fuse points (such as SRAM cells 1424 in FIGS. 4 and 5 or SRAM cell 1140 in FIG. 3) within each product term circuit 208 in main memory portion 1005 need be programmed during switch mode (as will be explained further herein, switch 1006 is illustrated for functional purposes only because the actual switching is carried out by the product term circuits 208 within main memory portion 1005). For example, referring back to FIG. 5, input line 1142 is configurable to receive one of the data signals in the re-ordered data set carried on bus 1033 from IRP 1000 in the switch mode. Thus, for each product term circuit 208 within main memory portion 1005, the number of SRAM cells that need to be specialized to provide a switch function depends on the number of data signals and their corresponding input lines 1142. For example, if there are 32 data signals carried on bus 1033 from IRP 1000 that may be received by 32 corresponding input lines 1142, the 32 SRAM cells 1424 controlling the fusing of these input lines 1142 in each product term circuit 208 of the main memory portion 1005 should be configured to support the switch mode. Unlike the fusing in logic mode, which is controlled by configuration signals, the fusing of these SRAM cells 1424 in main memory portion 1005 is controlled by the control signals in the re-ordered set of control signals carried on bus 1034 from IRP 1000. Referring now to SRAM cell 1140 in FIG. 3, bit line 1146 and word line 1144, which are configured to receive configuration signals from the non-volatile memory during the logic mode, are also configured to receive control signals from IRP 1000 during the switch mode. During switch operation, just one SRAM cell is fused in each product term circuit 208 in main memory portion 1005. The data input carried on signal input path 1142 that corresponds to this single fused SRAM cell will thus be expressed in the product term output because an AND of just one variable leaves the variable unchanged. In this fashion, each product term circuit 208 in main memory portion 1005 acts as a switch with respect to its data input. It will be appreciated that switch matrix 1006 illustrated in FIG. 7A is merely for functional representation in that the switching in switch mode is performed by the SRAM cells in main memory portion 1005 as just described.

The control signals provided by IRP 1000 must identify the SRAM cell to be activated for each relevant product term circuit 208. For example, with respect to SRAM cell 1140 of FIG. 3, bit line 1146 identifies a particular product term circuit 208, and word line 1144 identifies the relevant input line 1142. The address identifying the relevant word line 1144 may be denoted as the input address because it identifies the input line 1142 that will carry the data signal to be switched. Similarly, the address identifying the relevant bit line 1146 may be denoted as the output address because it identifies the product term circuit 208 that will output the switched data signal as its product term output. As seen in FIG. 7A, IRP 1000 provides a re-ordered set of control signals denoted as address signals A_IN (the input address) and A_OUT (the output address) on bus 1034 to a write address decoder 1002 so as to address a particular word and bit line. Write address decoder receives the A_OUT address and raises the appropriate bit line. For example, should the fuse point be implemented with SRAM cell 1140 of FIG. 3, one bit line 1146 is brought high by address decoder 1002 in response to decoding A_OUT. Similarly, should the fuse point be implemented with SRAM cell 1502A of FIG. 5, one bit line 1422A and its complement 1422B are activated by address decoder 1002 in response to decoding A-OUT. Write address decoder also decodes A_IN and activates the appropriate word line. For example, should the fuse point be implemented with SRAM cell 1140 of FIG. 3, one row word line 1144 is activated by address decoder 1002 in response to decoding A_IN. Address decoder 1002 activates these lines in response to a clock signal WE provided by IRP 1000 on lead 1035. Product term circuits 208 within IRP 1000, being appropriately programmed by configuration signal and in receipt of the un-ordered set of controls signals over bus 626 from routing structure 110, produce A_IN, A_OUT, and WE using split product terms 404 to provide the appropriate re-ordering of these control signals as discussed with respect to FIG. 8.

Shadow Memory

Referring again to FIG. 7A, address decoder 1002 can update the configuration cells within just one product term circuit 208 at any given cycle of clock WE. Should the main memory portion 1005 include 32 product term circuits 208, it would require 32 WE clock cycles to update its switching pattern. During this updating period, it could not be used as a switch. To allow dynamic updating of the switching pattern during switch mode operation using just one WE clock cycle, a subset or portion of the product term circuits 208 in programmable AND array 200 may be specialized to act as a shadow memory subset 1004 of product term circuits 208. Shadow memory 1004 has a subset of memory cells programmed corresponding to the programming of the fuse points effecting the switching pattern in main memory portion 1005. Thus, every programmed memory cell in main memory portion 1005 has a "shadow" corresponding memory cell in shadow memory subset 1004. To change the switching pattern of the data inputs during operation in the switch mode, a subset of the memory cells/fuse points within shadow memory 1004 may be programmed by address decoder 1002 as described above with respect to main memory portion 1005. The subset of memory cells thus programmed are arranged to correspond on a one-to-one basis with the subset of memory cells in main memory portion 1005 that control the fusing of data inputs ("memory cell" is used herein interchangeably with "fuse point"). The total number of product term circuits 208 in shadow memory 1004 thus mirrors that used in main memory portion 1005. For example, if main memory portion 1005 contains 32 product term circuits 208, shadow memory 1004 would contain 32 product term circuits 208. To completely update the contents of the shadow memory 1004 would thus take 32 write cycles. However, all the relevant configuration cells in main memory portion 1005 may then be updated according to the contents of the shadow memory 1004 in the following clock cycle. In this fashion, a user may change the switching behavior dynamically during operation in the switch mode.

The shadow memory feature may be further developed by dividing the shadow memory 1004 into a first shadow memory subset and a second shadow memory subset (not illustrated). The main memory portion 1005 may then be updated selectively according to the contents of either the first shadow memory subset or the second shadow memory subset depending upon a user's requirements at the time of the main memory portion 1005 reconfiguration.

An SRAM memory cell such as SRAM cell 1502B of FIG. 5 may be used to implement the configuration cells of shadow memory 1004. It will be appreciated, however, that a dual port SRAM cell is not necessary for the implementation of a shadow memory. In such an arrangement, the product term circuits 208 from shadow memory 1004 and main memory 1005 may be interleaved. As described above, the product term circuits 208 within main memory portion 1005 may have just a subset of their SRAM cells specialized to support the switch mode— the remainder of the SRAM cells would not be used to support the switch mode. Thus, these remaining SRAM cells may be used to form shadow memory 1004. In such an embodiment, the subset of product term circuits 208 used to form main memory 1004 is the same subset of product term circuits 208 used to form shadow memory 1004. Regardless of whether the subsets are co-extensive or exclusive, NMOS gates such as gates 1504A–1504D in FIG. 5 may be used to control the loading of signals from the shadow memory cell 1502B to the main memory portion memory cell 1502A during the update of main memory 1005.

It will thus be appreciated that IRP 1000 produces two very different kind of signals in the switch mode: data signals and control signals. Unlike logic signals, these signals must be presented in a predetermined order so that they may be received by the appropriate signal path. While routing structure 110 of FIG. 1 may be used to provide the required ordering, such use of routing structure burdens the routing resources. IRP 1000 thus relieves this burden by using spare product term circuits which would otherwise be unused during the switch mode.

IRP 1000 may receive signals from the routing structure 110 via a 68-bit-wide bus 626. Bus 626 may also be used in the logic mode to couple the logical inputs 290 from routing structure 110. IRP 1000 may have a DATAIN output port 1007, a data clock enable (DCE) output port 1008, a data clock (DCLK) output port 1009, a reset output port 1010, an UPDATE/BROADCAST/FLOWTHROUGH output port 1011, an address clock (ACLK) output port 1012, a write address (A_IN, A_OUT) output port 1013, an address clock enable (ACE) output port 1014 and a write enable (WE) output port 1015. Other split product term outputs from IRP 1000 are used to implement clock enable, clock and reset signals.

A first set of the MUXes 1016–1022 provide polarity selection for the split product term outputs from IRP 1000. A second set of MUXes 1023–1026 provide a selection between outputs of MUXes 1016–1022 and a global clock signal GCLK on line 686. The D flip flops 1027–1031 provide registers or buffers for signals from IRP 1000 to the shadow memory 1004 and the main memory portion 1005. The data inputs and outputs may be registered or unregistered.

Figures 7B, 7C, 7D:
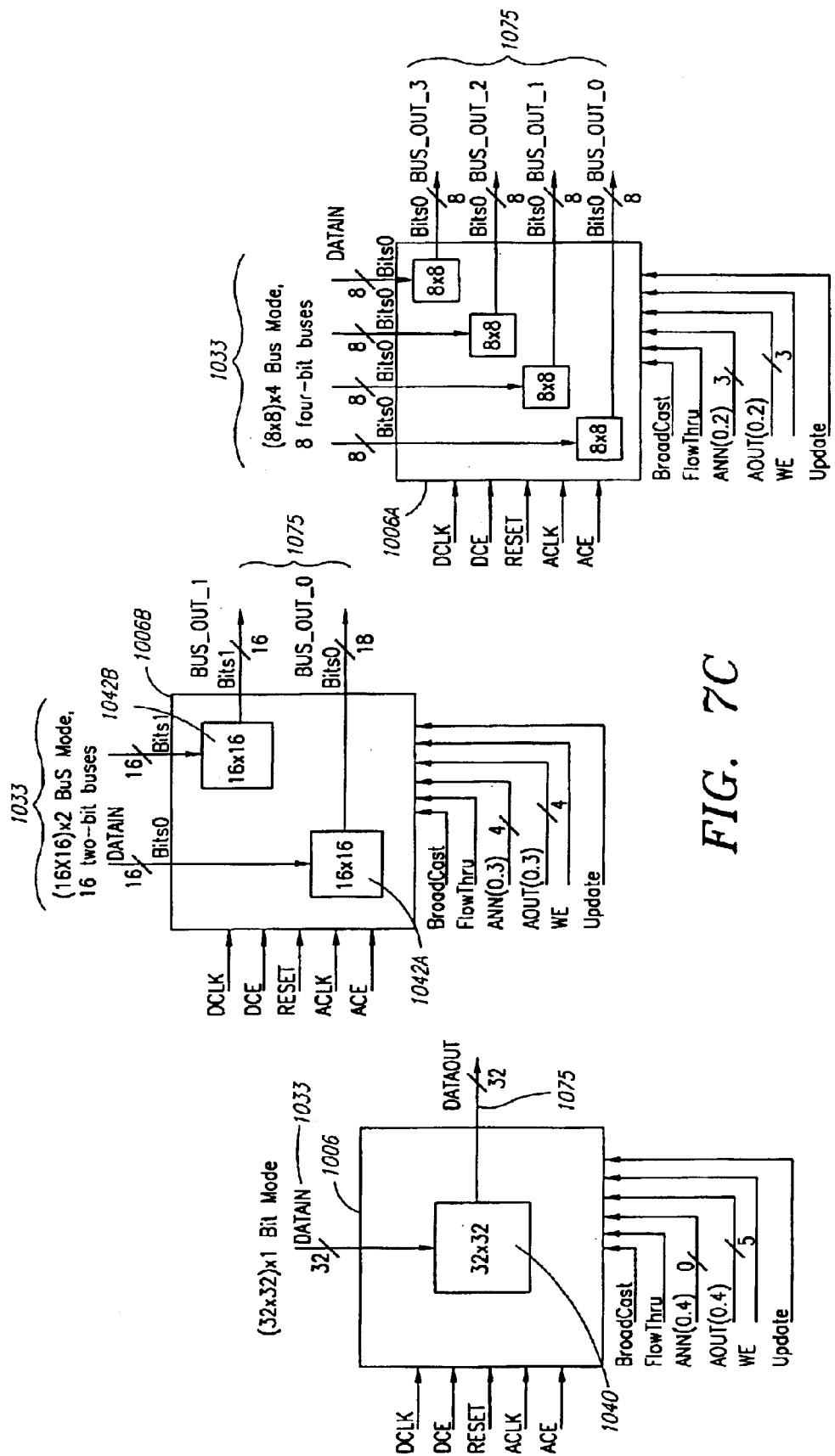
FIG. 7B illustrates one embodiment of a switch block within the programmable logic block of FIG. 7A.
FIG. 7C illustrates another embodiment of a switch block within the programmable logic block of FIG. 7A.
FIG. 7D illustrates another embodiment of a switch block within the programmable logic block of FIG. 7A.

Depending upon the programming determined by the control signals received from programmable logic block 102, various signal switching patterns may be implemented by switch matrix 1006. For example, FIG. 7B illustrates one embodiment of switch matrix 1006. Switch matrix 1006 is in bit mode and comprises a 32×32×1 switch 1040. Switch matrix 1006 in FIG. 7B has one connection per cycle for all modes. When switch matrix 1006 receives an asserted BROADCAST signal, it routes a 1-bit input carried on input bus 1033 (see also FIG. 7A) as identified by A_IN to each of the 32 1-bit output lines in output bus 1075 (see also FIG. 7A). When switch matrix 1006 receives an asserted FLOWTHROUGH signal, each 1-bit input line in bus 1033 outputs its value (either 0 or 1) to a corresponding 1-bit output line in bus 1075. For example, an input line 0 (not illustrated) outputs its value to output line 0 (not illustrated), input line 1 (not illustrated) outputs its value to output line 1 (not illustrated), etc.

FIG. 7C illustrates another embodiment of switch matrix 1006. The switch matrix 1006 is in bus mode and comprises two 16×16 switches 1042A, 1042B and input bus 1033 and output bus 1075 each comprises two sets of sixteen 1-bit lines. Both switches 1042A, 1042B may be updated at the same time with the same connections. Because there is a one-bit-to-one-bit association between a set of 16 1-bit input lines in bus 1033 and a set of 16 1-bit output lines in bus 1075, the switch matrix 1006 in FIG. 7C may use smaller address inputs. In other words, the AIN and AOUT inputs for the switch block 1006 in FIG. 7C may be four bits wide instead of 5 bits wide (as in the switch matrix 1006 of FIG. 7B).

FIG. 7D illustrates another embodiment of switch matrix 1006. The switch matrix 1006 is in bus mode and input bus 1033 and output bus 1075 each comprises four sets of eight 1-bit lines. All four switches 1044A–1044D may be updated at the same time with the same connections. The AIN and AOUT addresses for the switch block 1006C in FIG. 7D may be three bits wide.

In a MULTICYCLE MULTICAST mode, the switch blocks 1006 (FIGS. 7B–7D) route (multicast) a 1-bit input to multiple 1-bit outputs. Multiple clock cycles are used to load a routing configuration (A_OUT) into the shadow memory 1004 (FIG. 7A). The output address bits A_OUT may be referred to as 'encoded.' In a SINGLE CYCLE MULTICAST mode, a single clock cycle is used to load a routing configuration into the shadow memory 1004 (FIG. 7A). The output address bits A_OUT may be referred to as 'un-encoded.'

Figures 7E, 7F:
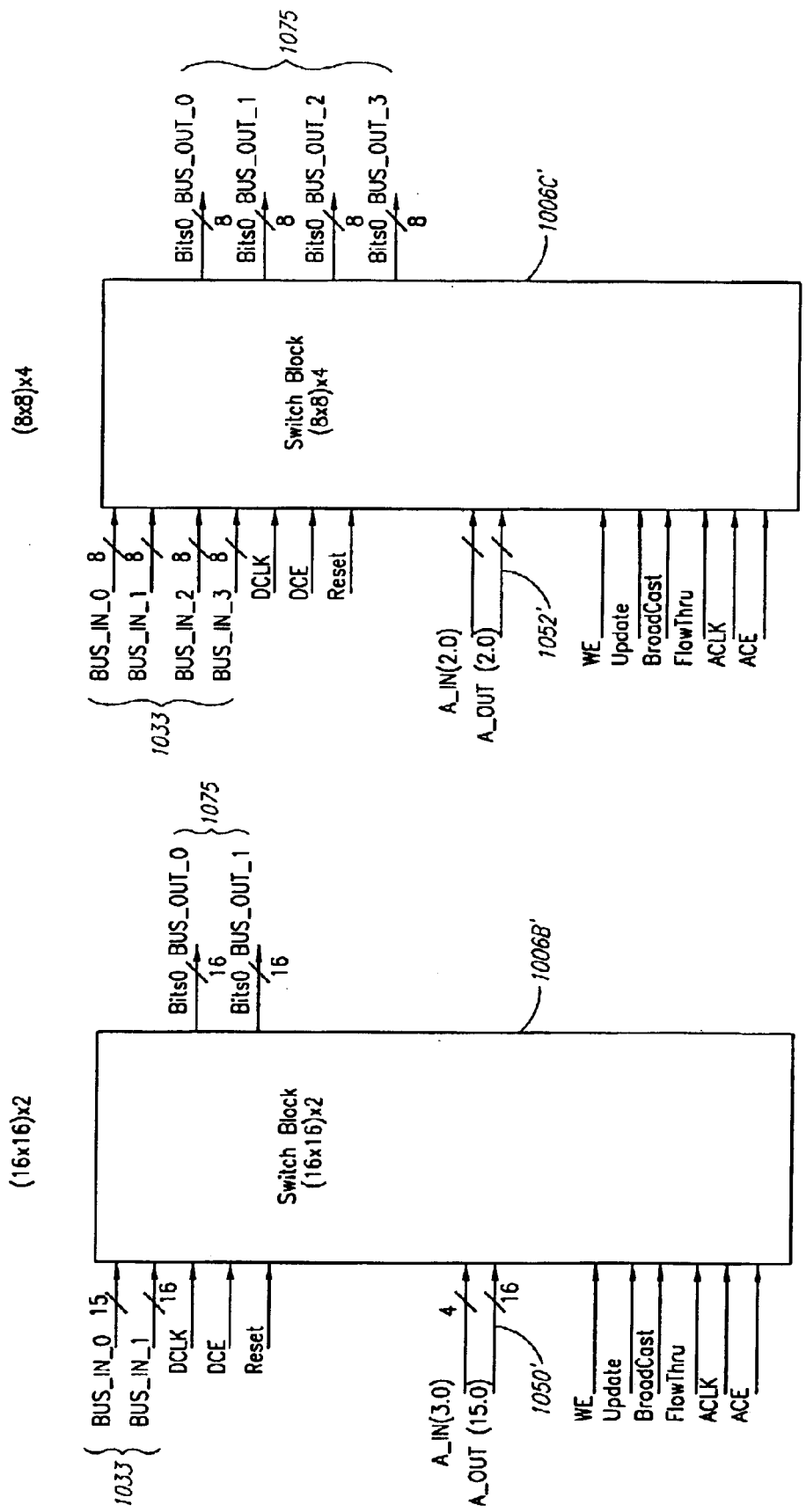
FIG. 7E illustrates one embodiment of a 16×16×2 switch block in a SINGLE CYCLE MULTICAST mode with a 16-bit wide A_OUT output bus.
FIG. 7F illustrates one embodiment of an 8×8×4 switch block in a DUAL CYCLE MULTICAST mode with an 8-bit wide bus A_OUT.

FIG. 7E illustrates one embodiment of switch matrix 1006 in a SINGLE CYCLE MULTICAST mode with output bus 1075 comprising two sets of sixteen 1-bit lines. FIG. 7F illustrates one embodiment of an 8×8×4 switch block 1006 in a DUAL CYCLE MULTICAST mode with an 8-bit wide bus 1052 supplying A_OUT.

Figures 7G, 7H:
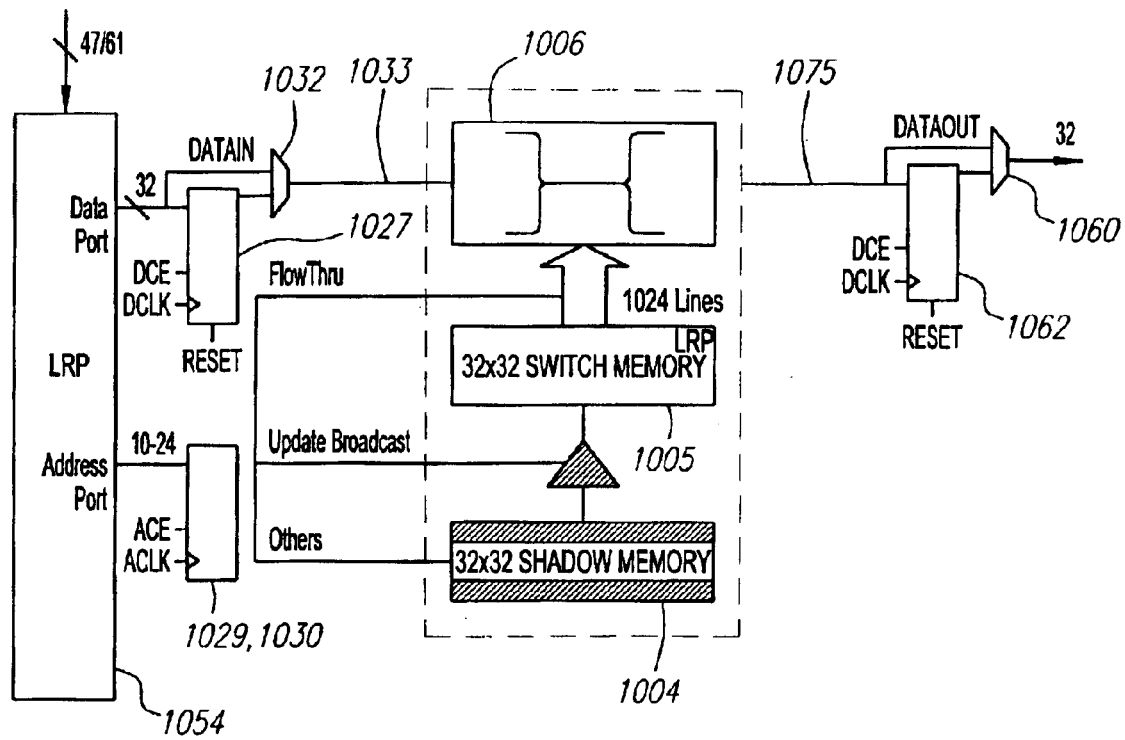
FIG. 7G illustrates one embodiment of the switch and other components in the programmable logic block of FIG. 7A.
FIG. 7H illustrates a plurality of switch timing parameters for the programmable logic block of FIG. 7A.
Figure 71:
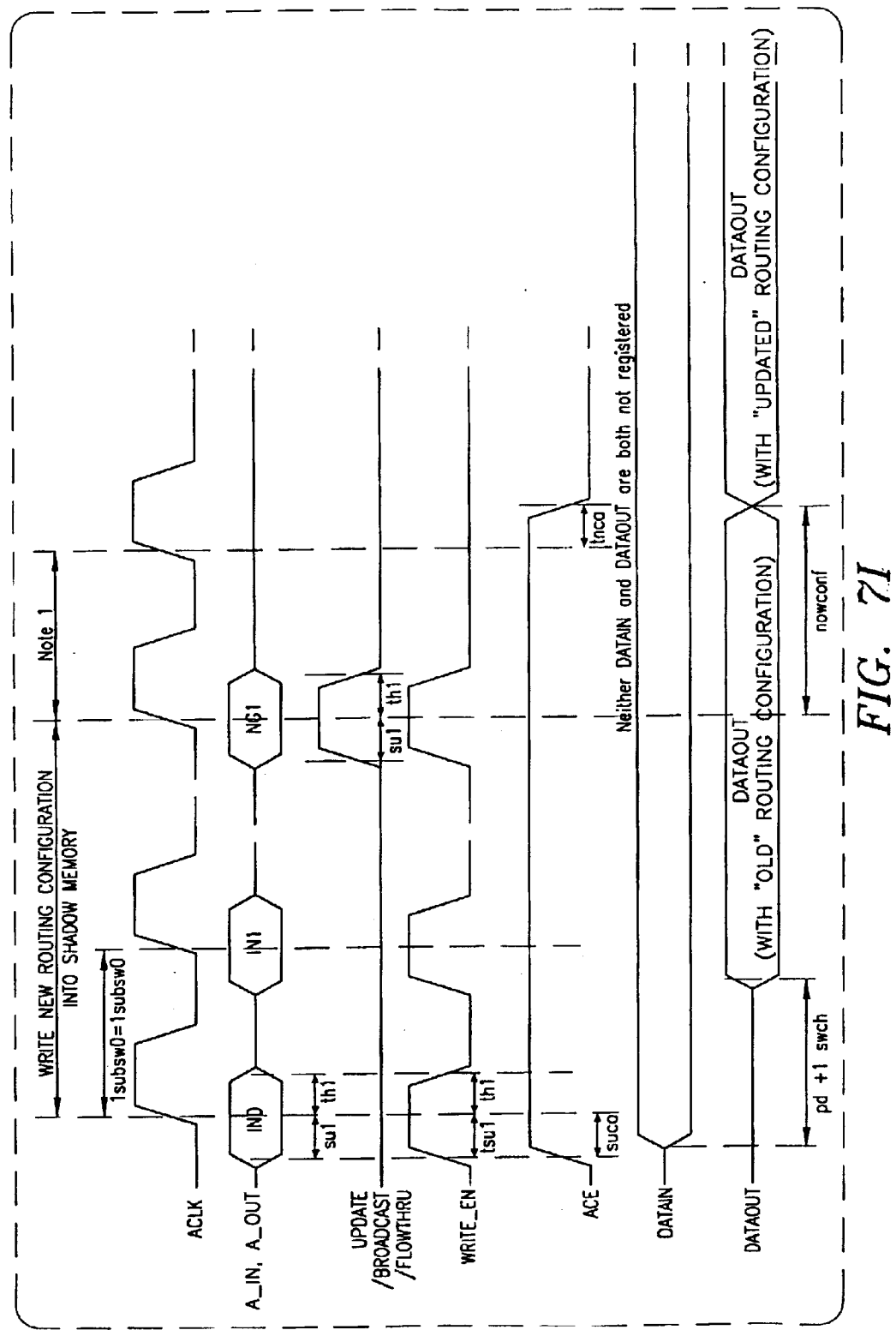
Figure 7J:
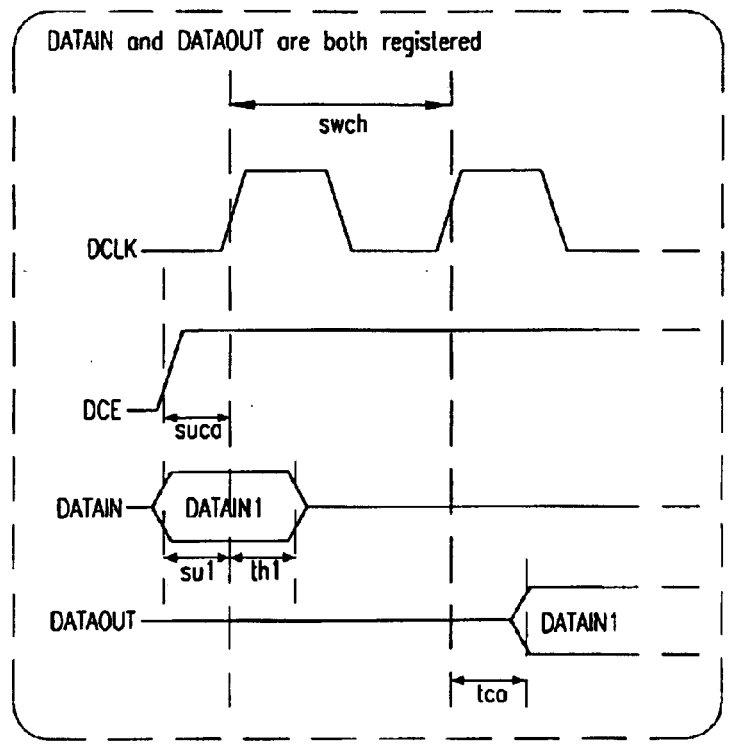
Figure 7K:
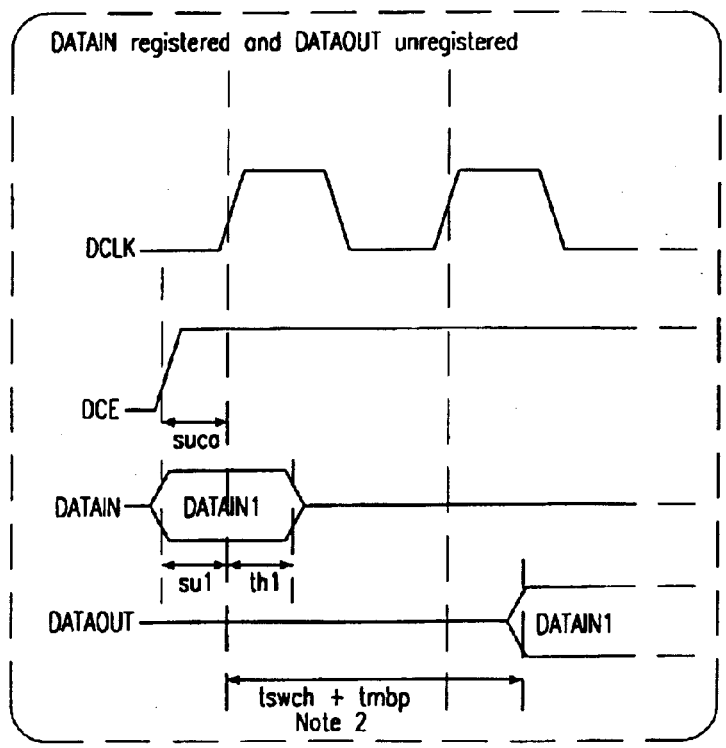
Figure 7L:
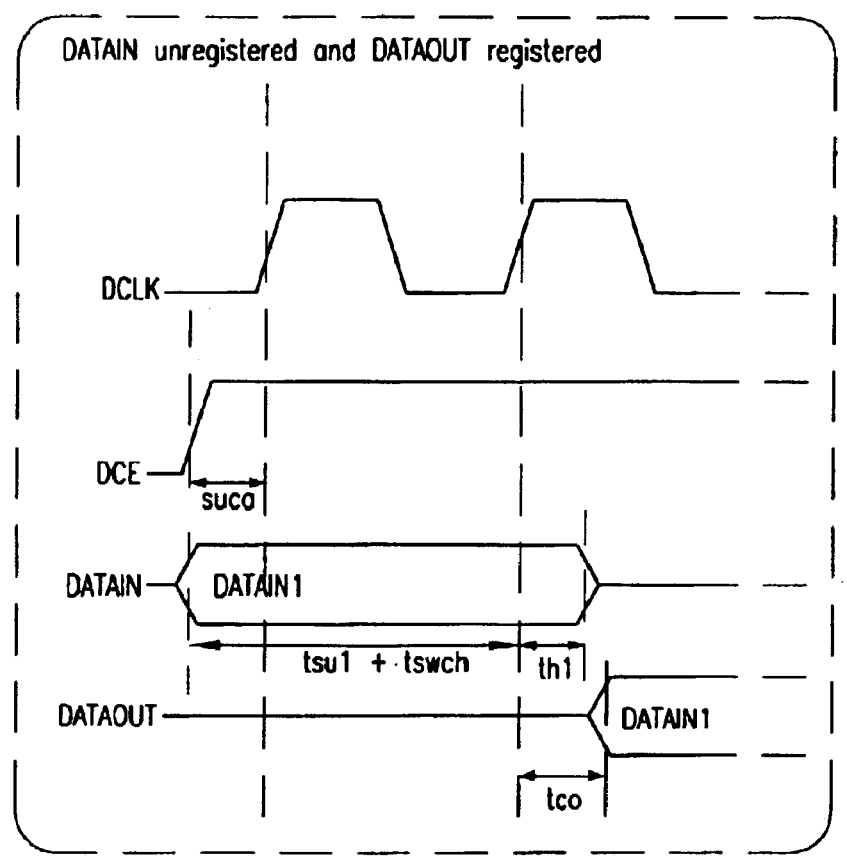

FIG. 7G illustrates one embodiment of the switch matrix 1006 and other components in the programmable logic block 102 of FIG. 7A. FIG. 7G illustrates a portion 1054 of the routing structure, a data port register 1027, an address port register 1030, a MUX 1032, the switch matrix 1006, the shadow memory 1004, the main memory portion 1005, a DATAOUT register 1062 and a DATAOUT MUX 1060.

The routing portion 1054 in FIG. 7G may enhance switch functionality by loading a routing configuration (A_OUT) to the shadow memory 1004, while the switch matrix 1006 (FIG. 7G) is transferring data from DATAIN to DATAOUT. The routing portion 1054 then asserts the UPDATE signal, which loads the routing configuration from the shadow memory 1004 to the main memory 1005 in a single cycle.

In FLOWTHROUGH mode, the shadow memory 1004 and main memory 1005 do not have to be updated. Thus, the switch matrix 1006 conforms to the FLOWTHROUGH mode as long as the FLOWTHROUGH signal is asserted. When the FLOWTHROUGH signal is de-asserted, the switch matrix 1006 reverts back to the routing configuration stored in the main memory 1005.

FIG. 7H illustrates a plurality of switch timing parameters for the programmable logic block 102 of FIG. 7A. FIGS. 7I–7L illustrate exemplifying timing diagrams for the programmable logic block 102 of FIG. 7A.

Consider the advantages that flow from re-using the memory cell/fuse points in a product term circuit to function as switch points as described herein. Should a user desire a 32×32 bit cross point switch using a programmable AND array that is not configured to practice the present invention, 32 32:1 multiplexers are necessary. Implementing these multiplexers using product terms requires 32 product term outputs (and thus 32 product term circuits) for each 32:1 multiplexer. Hence, a 32×32 bit cross point switch implemented in a programmable AND array using product terms requires 1024 product term circuits. However, as discussed above, a 32×32 cross point switch can be implemented using just 32 product term circuits (to form main memory portion 1005) and 32 additional product term circuits (to form IRP 1000). This represents a 1024:64 product term circuit savings. Should a user desire the shadow memory feature using distinct product term circuits, a 1024:96 product term savings may still be realized.

The above-described embodiments of the present invention are merely meant to be illustrative and not limiting. For example, other types of memory cells may be used in place of SRAM memory cells to form the fuse points for a product term circuit. Regardless of the type of memory cell used to form the fuse points, however, the memory cells may be re-used in a switch mode according to the present invention. It will thus be obvious to those skilled in the art that various changes and modifications may be made without departing from this invention in its broader aspects. The appended claims encompass all such changes and modifications as fall within the true spirit and scope of this invention.

What is claimed is:

1. A programmable logic device, comprising:
a plurality of programmable blocks each having a logic mode and a switch mode, wherein each programmable block includes a plurality of product term circuits; and
a routing structure for routing signals to the programmable blocks,
wherein each product term circuit is programmable in response to configuration signals in the logic mode to select logic signals received from the routing structure and provide a product term output based on the selected logic signals,
and wherein a switch subset of the product term circuits are each programmable in the switch mode according to a set of control signals coupled from the routing structure such that each product term circuit in the switch subset may select a signal from a set of data signals and provide a data output based on the selected signal.

2. The programmable logic device of claim 1, wherein a re-ordering subset of the product term circuits are each programmable according to configuration signals in the switch mode to select a signal from the set of control and data signals coupled from the routing structure to provide output signals based upon the selected signals, and wherein the re-ordering subset of product term circuits are programmed in the switch mode such that its output signals form a re-ordered set of the control and data signals, and
wherein the switch set of product term circuits are each programmable in the switch mode according to the control signals in the re-ordered set of control and data signals and the data signal selected by each product term circuit in the switch set is selected from the data signals in the re-ordered set of control and data signals.

3. The programmable logic device of claim 2, wherein each product term circuit in the plurality of product term circuits includes a plurality of N configuration cells arranged according to a corresponding plurality of N input signal paths, and wherein each input signal path may receive a signal from the routing structure such that each product term circuit is programmable in the logic mode by selectively activating its N configuration cells according to the configuration signals, whereby the product term output for each product term circuit is affected by the signals carried on input signal paths that correspond to activated configuration cells.

4. The programmable logic device of claim 3, wherein a data subset of the N input signal paths for the switch subset of product term circuits may each receive a signal from the re-ordered set of data signals, and wherein the configuration cells corresponding to the data subset of input signals paths in each of the product term circuits in the switching subset are configured to be programmed in the switch mode by the re-ordered set of control signals such that the re-ordered data signal carried on the data subset's input signal path corresponding to an activated configuration cell will form the data output in the switch mode.

5. The programmable logic device of claim 4, wherein each programmable block further comprises:
a plurality of N/2 input ports coupled to receive signals from the routing structure, wherein each input port may form the true and complement of its received signal such that N signals may be produced by the plurality of N/2 input ports, and wherein each of the N input signal paths for each product term circuit are coupled to receive a corresponding one of the N signals such that N input signal paths form a set of N/2 true input signal paths and a set of N/2 complement input signal paths.

6. The programmable logic device of claim 5, wherein each of the product term circuits in the re-ordering subset are configurable in the switch mode to provide a first product term output that is the product of the signals carried on the N/2 true input signal paths that correspond to activated configuration cells and to provide a second product term output that is the product of the signals carried on the N/2 complement input signal paths that correspond to activated configuration cells, and wherein the re-ordered set of control and data signals comprise first product term outputs and second product term outputs.

7. The programmable logic device of claim 6, wherein each configuration cell comprises a one-bit memory cell that is activated by storing a particular binary state.

8. The programmable logic device of claim 7, wherein the data signals in the re-ordered set of address and data signals form a set of L data signals, the data set of input signal paths forms L input signal paths, and the switching subset of product term circuits has L product term circuits, whereby the switching subset of product term circuits may form an L by L switch matrix.

9. The programmable logic device of claim 7, wherein each one-bit memory cell is an SRAM cell.

10. Be programmable logic device of claim 8, wherein the control signals in the re-ordered set of control and data signals form a set of address signals, and wherein a subset of the memory cells in the plurality of product term circuits forms a shadow memory subset, the programmable logic device further comprising:

an address decoder coupled to the memory cells in the shadow memory subset, wherein the address decoder is configured to decode the address signals in the set of address signals so as to identify memory cells to be activated in the shadow memory subset, and wherein the memory cells in the switching subset that correspond to the data subset of input signal paths are configured to be programmed according to the contents of the memory cells in the shadow memory subset.

11. The programmable logic device of claim 10, wherein the shadow memory subset of memory cells comprises a first shadow memory subset and a second shadow memory subset, and wherein the memory cells in the switching subset that correspond to the data subset of input signal paths are selectively programmable according to the contents of the memory cells in either the first shadow memory subset or the second shadow memory subset.

12. A method, comprising:

providing a programmable logic device having a programmable block including a plurality of product term circuits coupled to receive signals from a routing structure;

programming the plurality of product term circuits with configuration signals;

based upon the configuration signal programming, selecting at each product term circuit a set of logic signals coupled from the routing structure;

processing the set of logic signals in each product term circuit to produce a product term output;

programming a switch subset of the product term circuits with control signals coupled from the routing structure such that each product term circuit in the switch subset may select a signal from a set of data signals coupled from the routing structure and provide a data output based on the selected signal, and based upon the control signal programming, routing the set of data signals through the switch subset of product term circuits to provide a set of data outputs, wherein the routing of the set of data signals occurs dynamically during operation of the programmable logic device.

13. The method of claim 12, further comprising:

programming a re-ordering subset of the product term circuits with configuration signals such that each product term circuit in the re-ordering subset may select a signal from the set of control and data signals coupled from the routing structure and provide output signals based upon the selected signal; and based upon the programming of the re-ordering subset; providing a set of output signals from the re-ordering subset of product term circuits such that the set of output signals is a re-ordered set of the set of control and data signals coupled from the routing structure, wherein the switch subset is programmed with the control signals in the re-ordered set and the data signals routed through the switch subset are selected from the re-ordered set.

14. A product term circuit, comprising:

a plurality of N input signal paths, an AND gate for providing a product term output of selected signals; and a plurality of N configuration cells arranged on a one-to-one basis with the plurality of N input signal paths such that a given configuration cell may be programmed to control whether a signal carried on its corresponding input signal path is selected to couple to the AND gate, wherein the plurality of N configuration cells are configured to be programmable by configuration signals in a logic mode, and wherein a subset of the plurality of N configuration cells are configured in a switch mode to be programmable by control signals coupled from a routing structure such that a single signal carried on one of the signal paths in the plurality of N input signal paths is selected to couple to the AND gate, whereby in the switch mode the product term circuit acts as a switch with respect to the single selected signal.

15. The product term circuit of claim 14, wherein the subset of the plurality of N configuration cells are dynamically programmable by control signals during operation of the product term circuit.

16. A programmable logic device comprising:

a plurality of programmable logic blocks;

a routing structure for routing signals to and between the programmable logic blocks; and a plurality of product term circuits within a programmable block, each product term circuit configured in a logic mode to logically AND multiple input signals received from the routing structure and configured in a switch mode to switch a single input signal received from the routing structure.

17. The programmable logic device of claim 16, wherein the plurality of product term circuits form a partially populated cross point switch when configured in switch mode.

18. The programmable logic device of claim 16, wherein the plurality of product term circuits are dynamically configurable.

19. The programmable logic device of claim 16, wherein each product term circuit comprises:

a plurality of input signal paths;

an AND gate operable to provide a product term circuit output; and for each input signal path, a configuration cell configurable to couple the signal path to the AND gate, wherein in logic mode each configuration cell is configurable to couple its signal path to the AND gate and wherein in switch mode only one configurable cell is configured to couple its signal path to the AND gate.

20. The programmable logic device of claim 16, including a shadow memory 15 programmable to store a switching pattern for configuring the product term circuits in the switch mode.

* * * * *

UNITED STATES PATENT AND TRADEMARK OFFICE
CERTIFICATE OF CORRECTION

PATENT NO. : 6,861,870 B1
DATED : March 1, 2005
INVENTOR(S) : Jason Cheng et al.

Page 1 of 1

It is certified that error appears in the above-identified patent and that said Letters Patent is hereby corrected as shown below:

<u>Column 13,</u>
Line 8, "Be programmable" should read -- The programmable --.

Signed and Sealed this

Twenty-seventh Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,861,870 B1
DATED : March 1, 2005
INVENTOR(S) : Cheng et al.

It is certified that error appears in the above-identified patent and that said Letters Patent is hereby corrected as shown below:

Title page,
Item [60], Related U.S. Application Data, should read:
-- Continuation-in-part of application no. 10/133,106, filed on April 26, 2002. --.

Signed and Sealed this

Thirty-first Day of January, 2006

JON W. DUDAS
*Director of the United States Patent and Trademark Office*